US009651718B2

(12) United States Patent
Chen et al.

(10) Patent No.: US 9,651,718 B2
(45) Date of Patent: May 16, 2017

(54) PHOTONIC APPARATUS WITH PERIODIC STRUCTURES

(71) Applicant: Forelux Inc., Taipei (TW)

(72) Inventors: Shu-Lu Chen, Taipei (TW); Yun-Chung Na, Hsinchu (TW)

(73) Assignee: Forelux Inc., Taipei (TW)

( * ) Notice: Subject to any disclaimer, the term of this patent is extended or adjusted under 35 U.S.C. 154(b) by 120 days.

(21) Appl. No.: 14/601,737

(22) Filed: Jan. 21, 2015

(65) Prior Publication Data

US 2015/0212242 A1  Jul. 30, 2015

Related U.S. Application Data

(60) Provisional application No. 61/932,232, filed on Jan. 27, 2014, provisional application No. 61/946,799, (Continued)

(51) Int. Cl.
*G02F 1/15* (2006.01)
*G02B 3/08* (2006.01)
*G02F 1/29* (2006.01)
*H01L 33/58* (2010.01)
*H01L 31/0232* (2014.01)
(Continued)

(52) U.S. Cl.
CPC .............. *G02B 3/08* (2013.01); *G02B 5/188* (2013.01); *G02B 5/189* (2013.01); *G02B 5/1876* (2013.01); *G02B 5/203* (2013.01); *G02B 6/124* (2013.01); *G02F 1/29* (2013.01); *H01L 31/02327* (2013.01); *H01L 33/58* (2013.01); *G02B 1/10* (2013.01); *G02B 2006/12102* (2013.01);
(Continued)

(58) Field of Classification Search
CPC ............ G02B 1/10; G02B 2006/12102; G02B 2006/12107; G02B 2006/12109; G02B 3/08; G02B 5/1876; G02B 5/188; G02B 5/189; G02B 5/203; G02B 6/124; G02F 1/29; G02F 1/015; G02F 2001/0151; G02F 2001/0152; H01L 31/02327; H01L 33/58
See application file for complete search history.

(56) References Cited

U.S. PATENT DOCUMENTS 6,802,073 B1 * 10/2004 Inase ................. G11B 11/10584
369/13.38
7,095,484 B1 * 8/2006 Fries .................... G03F 7/70291
355/53

(Continued)

FOREIGN PATENT DOCUMENTS

EP     2634605      9/2013
JP     2007-058100  3/2007

OTHER PUBLICATIONS

Extended European Search Report issued in EP14189392.5-1553 on Mar. 2, 2015, 7 pages.

(Continued)

*Primary Examiner* — Scott J Sugarman
*Assistant Examiner* — Vipin Patel
(74) *Attorney, Agent, or Firm* — Fish & Richardson P.C.

(57) ABSTRACT

An optical apparatus including a substrate and a refractive element formed above the substrate. The refractive element including a surface with a predetermined radius of curvature, and a group of periodic structures formed on the surface configured to refract or to filter one or more wavelengths of an incident light.

18 Claims, 20 Drawing Sheets

Related U.S. Application Data filed on Mar. 2, 2014, provisional application No. 62/063,426, filed on Oct. 14, 2014, provisional application No. 62/079,498, filed on Nov. 13, 2014, provisional application No. 62/086,727, filed on Dec. 3, 2014.

(51) Int. Cl.
  *G02B 5/18* (2006.01)
  *G02B 5/20* (2006.01)
  *G02B 6/124* (2006.01)
  *G02B 1/10* (2015.01)
  *G02B 6/12* (2006.01)

(52) U.S. Cl.
  CPC .............. *G02B 2006/12107* (2013.01); *G02B 2006/12109* (2013.01)

(56) References Cited

U.S. PATENT DOCUMENTS

| | | | |
|---|---|---|---|
| 2003/0197906 A1* | 10/2003 | Furuta | G02B 1/118 359/15 |
| 2004/0114642 A1 | 6/2004 | Bullington | |
| 2005/0240341 A1* | 10/2005 | Fielhauer | G01C 15/002 701/532 |
| 2007/0263973 A1 | 11/2007 | Van Laere et al. | |
| 2012/0082016 A1 | 4/2012 | Komura | |
| 2013/0279844 A1 | 10/2013 | Na et al. | |

OTHER PUBLICATIONS

Partial European Search Report in Application No. 15152635.7, dated May 28, 2015, 8 pages.

European Search Report in Application No. 15152635.7 dated Aug. 26, 2015, 6 pages.

U.S. Appl. No. 14/291,253, "Optical Device for Redirecting Incident Electromagnetic Wave," filed May 30, 2014, 39 pages.

Chen et al., "Fabrication-Tolerant Waveguide Chirped Grating Coupler for Coupling to a Perfectly Vertical Optical Fiber," IEEE Photonics Technol Lett., Dec. 2008, 20(23):1914-1916.

Covey and Chen, "Efficient perfectly vertical fiber-to-chip grating coupler for silicon horizontal multiple slot waveguides," Optics Express, May 2013, 21(9):10886-10896.

Ding et al., "Ultrahigh-efficiency apodized grating coupler using fully etched photonic crystals," Optics Lett., Aug. 2013, 38(15):2732-2734.

Lalanne and Hugonin, "Bloch-Wave Engineering for High-Q, Small-V Microcavities," IEEE J Quantum Electronics, Nov. 2003, 39(11):1430-1438.

Li et al., "CMOS-compatible high efficiency double-etched apodized waveguide grating coupler," Optics Express, Apr. 2013, 21(7):7868-7874.

Mekis et al., "A Grating-Coupler-Enabled CMOS Photonics Platform," IEEE J Selected Topics Quantum Electronics, May/Jun. 2011, 17(3):597-608.

Na et al., "Efficient broadband silicon-on-insulator grating coupler with low backreflection," Optics Lett., Jun. 2011, 36(11):2101-2103.

Roelkens et al., "High efficiency grating coupler between silicon-on-insulator waveguides and perfectly vertical optical fibers," Optics Lett., Jun. 2007, 32(11):1495-1497.

Schrauwen et al., "Polymer wedge for perfectly vertical light coupling to silicon," Integrated Optics: Devices, Materials, and Technologies XIII, Jan. 2009, 8 pages.

Taillaert et al., "A Compact Two-Dimensional Grating Coupler Used as a Polarization Splitter," IEEE Photonics Technol Lett., Sep. 2003, 15(9):1249-1251.

Wang et al., "Embedded Slanted Grating for Vertical Coupling Between Fibers and Silicon-on-Insulator Planar Waveguides," IEEE Photonics Technol Lett., Sep. 2005, 17(9):1884-1886.

Wu et al., "A critically coupled Germanium photodetector under vertical illumination," Optics Express, Dec. 2012, 20(28):29338-29346.

* cited by examiner

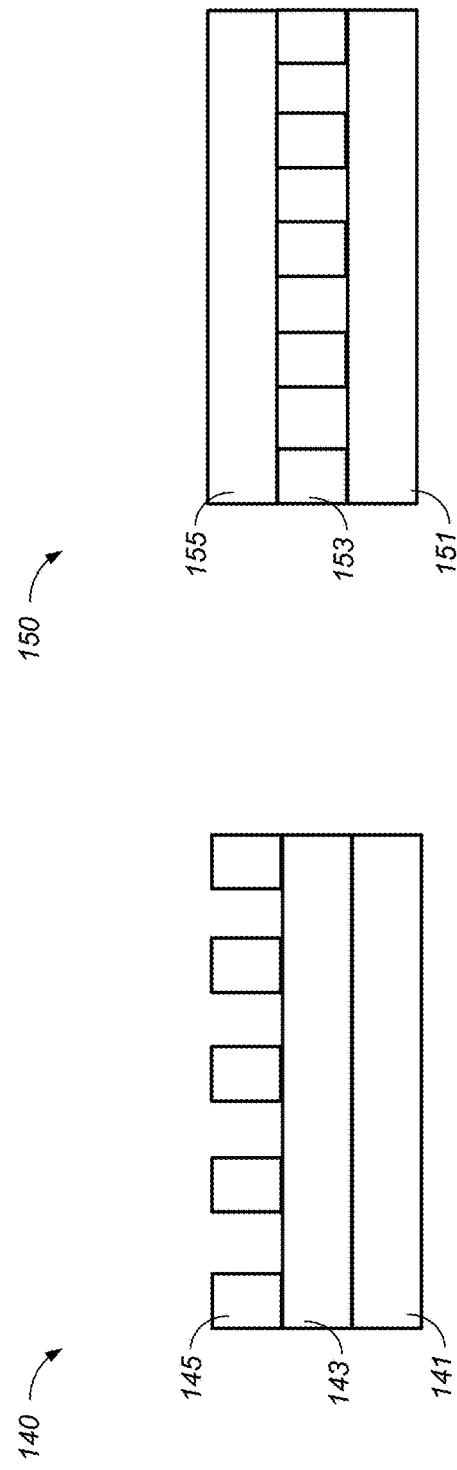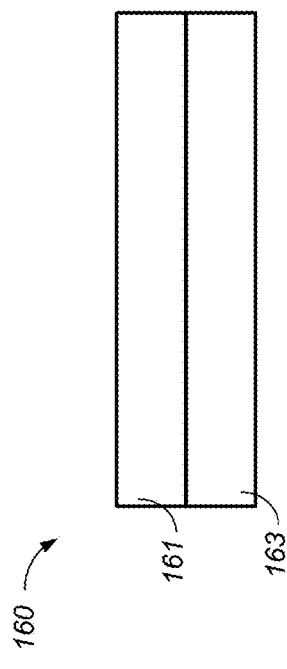
FIG. 1D
FIG. 1E
FIG. 1C

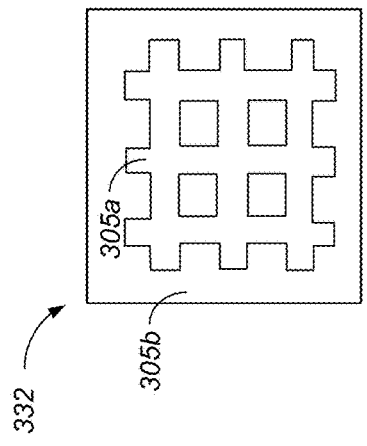
FIG. 3B
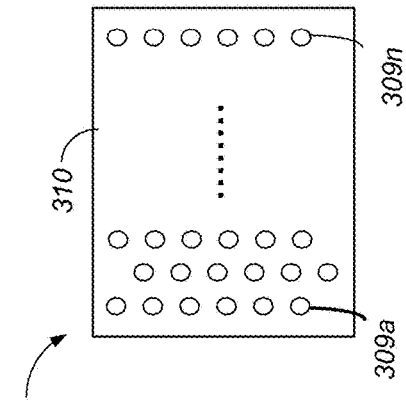
FIG. 3D
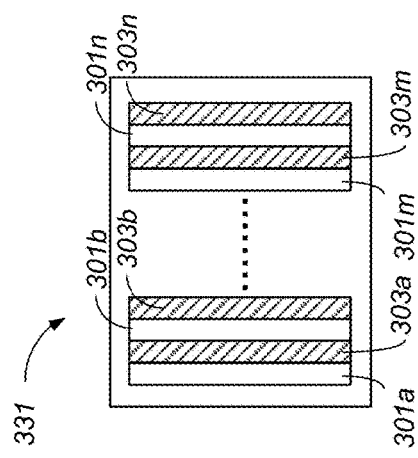
FIG. 3A
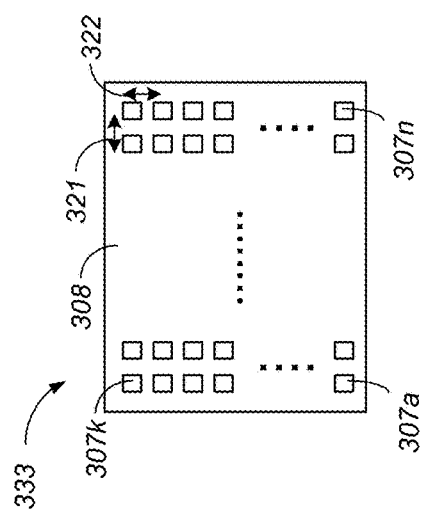
FIG. 3C
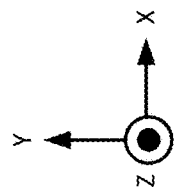

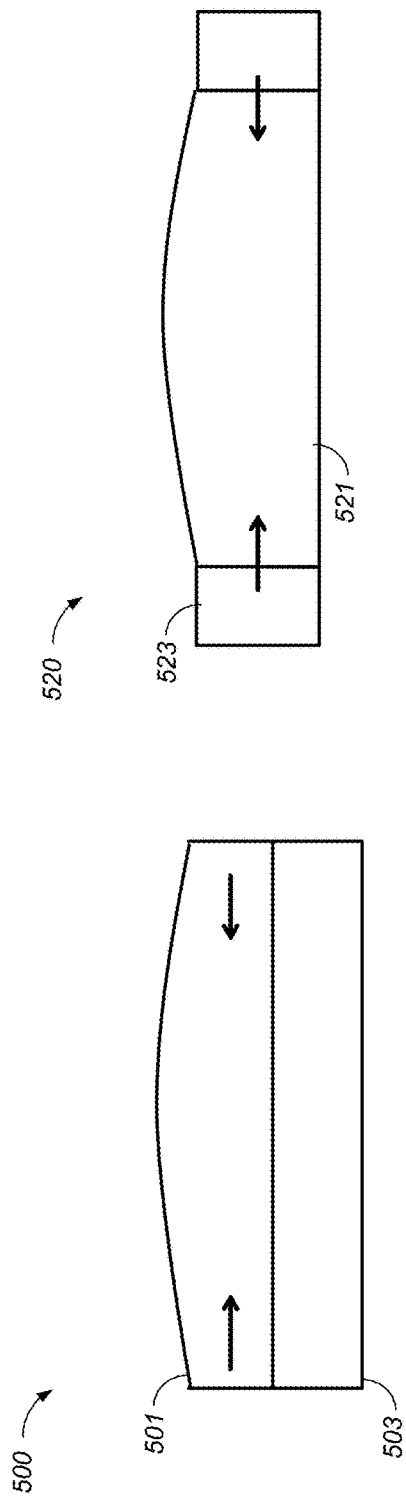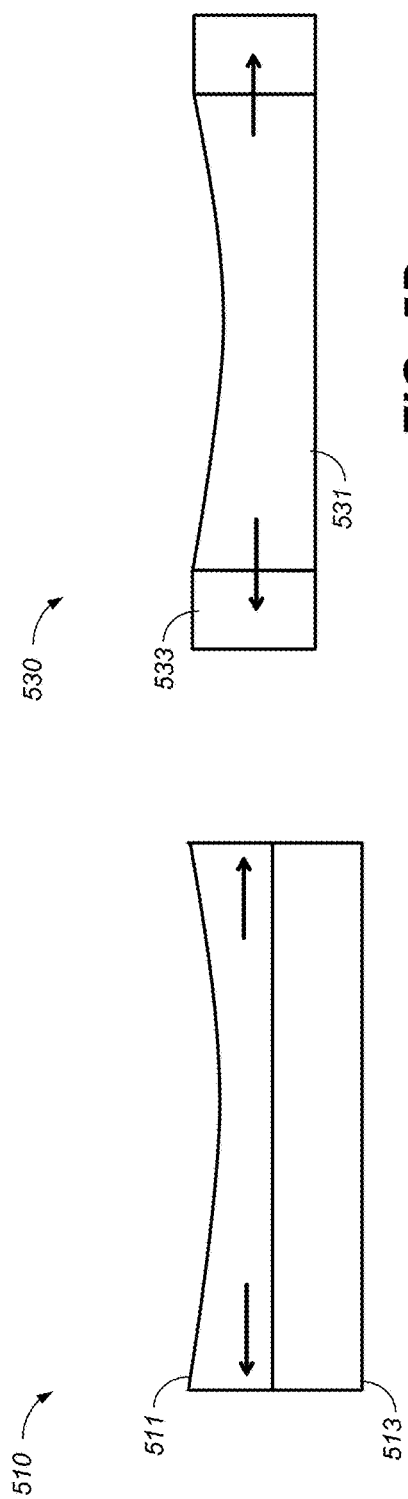

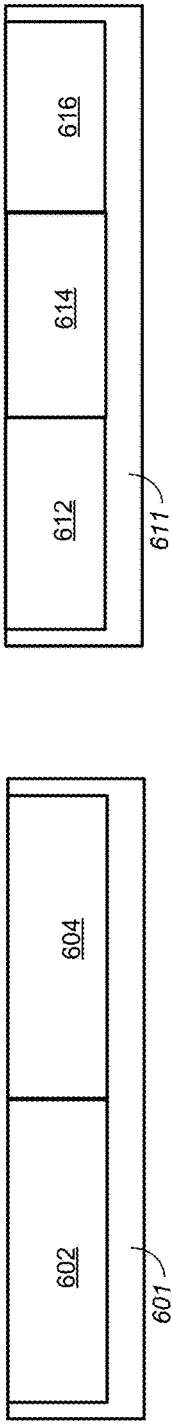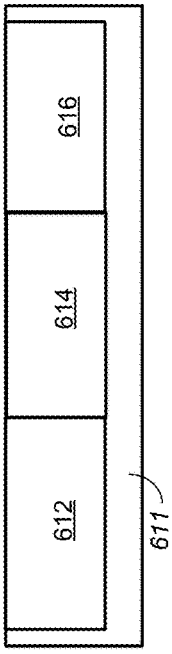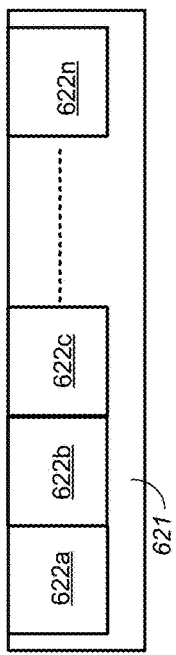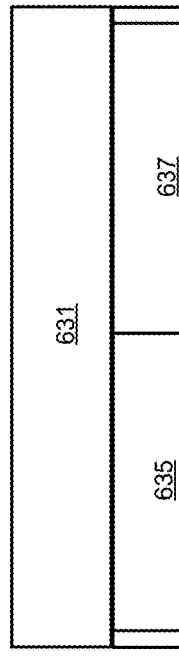
FIG. 6A
FIG. 6B
FIG. 6C
FIG. 6D

Figure 10. Schematics of a square PC lattice.

Figure 11. For a chosen thickness, this figure provides the reflectivity as a function of wavelength when the radius and the lattice constant are adjusted Figure 12. Reflectivity as a function of radius given thickness/lattice constant equal to 225 nm/ 1 μm. The yellow mark is the transmission band that we are interested in.

Figure 13. (a) The reflection spectrum with the condition t=22, a=1 µm, and r=0.35a. The transmission band is centered at µm (b) Enlargement the transmission band where the bandwidth is as wide as 20 nm.

Figure 14. Exemplary illustration of a CWDM application

Figure 15. Top view and cross-section view to illustrate the concept of polarization independent photonic crystal design according to different incident angle

PHOTONIC APPARATUS WITH PERIODIC STRUCTURES

CROSS-REFERENCE TO RELATED APPLICATIONS

This patent application claims the benefit of U.S. Provisional Patent Application No. 61/932,232, filed Jan. 27, 2014, U.S. Provisional Patent Application No. 61/946,799, filed Mar. 2, 2014, U.S. Provisional Patent Application No. 62/063,426, filed Oct. 14, 2014, U.S. Provisional Patent Application No. 62/079,498, filed Nov. 13, 2014, and U.S. Provisional Patent Application No. 62/086,727, filed Dec. 3, 2014 which are incorporated by reference herein.

BACKGROUND

This specification relates to coupling light using a lens.

Light is guided between a photonic integrated circuit and an external medium using a refractive element formed on the photonic integrated circuit.

SUMMARY

According to one innovative aspect of the subject matter described in this specification, light may be generated, guided, processed, or detected by one or more active and/or passive optical components of a photonic integrated system. A refractive element may be formed on the photonic integrated circuit to reciprocally guide light in the photonic integrated circuit from or to an external medium, respectively. Periodic structures may also be formed on the refractive element to refract or to filter light in the photonic integrated circuit from or to an external medium.

In general, one innovative aspect of the subject matter described in this specification can be embodied in an optical apparatus that includes a refractive element formed above the optical medium, the refractive element including a surface with a predetermined radius of curvature, and a group of periodic structures formed on the surface, the group of periodic structures configured to refract or to filter one or more wavelengths of an incident light.

This and other implementations can each optionally include one or more of the following features. The optical apparatus may include a cladding element formed over the refractive element, where an effective refractive index of the cladding element is lower than an effective refractive index of the refractive element. The cladding element may include one or more layers of nitride, oxide, air, or an organic material. The group of periodic structures may possess a 90 degree rotational symmetry.

The optical medium may include an active element configured to absorb at least a portion of the incident light or to emit light. The active element may include one or more layers of silicon, germanium, tin, or III-V compounds. The optical apparatus may include a second refractive element optically coupled to the refractive element, where an effective refractive index of the second refractive element is different from or equal to an effective refractive index of the refractive element. The second refractive element may include a second group of periodic structures.

The optical apparatus may include a modulation element coupled to the refractive element, the modulation element configured to change an effective refractive index of the refractive element by applying an electrical field to the refractive element to cause a change in a carrier concentration or a change in a mechanical structure. The modulation element may include a p-n junction configured to apply an electrical field to change an effective refractive index of the refractive element.

The optical apparatus may include a modulation element coupled to the refractive element, the modulation element configured to change a direction of at least a portion the incident light exiting the refractive element, a depth of focus of the incident light exiting the refractive element, or a selection of one or more wavelengths filtered by the group of periodic structures of the refractive element. The modulation element may include a Micro-Electro-Mechanical System (MEMS) configured to apply an electrical field to exert a mechanical force to change (i) the predetermined radius of curvature of the surface, (ii) a position of the refractive element relative to the optical medium, (iii) or an orientation of the refractive element relative to an optical axis of the incident light.

The predetermined radius of curvature of the refractive element may be formed by a process-related strain. The predetermined radius of curvature of the refractive element may be formed by using a grayscale mask. The group of periodic structures may be configured to focus or defocus the incident light by a joint phase shift. The group of periodic structures may be configured to filter one or more wavelengths of the incident light by a guided mode resonance. The refractive element may include silicon partially filled with nitride or oxide or air. A thickness of the optical medium corresponds to a focal length of the refractive element. The refractive element may be bonded to a layer formed on the optical medium.

To filter, focus, or defocus one or more wavelengths of the incident light, (i) one or more periodic structures of the group of periodic structures may be filled with a material having a different refractive index from an effective refractive index of the refractive element, (ii) one or more periodic structures of the group of periodic structures may be formed to have a different radius from a radius of one or more other periodic structures of the group of periodic structures, or (iii) a plurality of periodic structures of the group of periodic structures may be formed with a locally non-uniform period.

Advantageous implementations may include one or more of the following features. Forming a refractive element that refracts and filters light as one optical component may decrease integration complexity with other optical components in an optical system. Forming a refractive element that refracts and filters light as one optical component may decrease the fabrication cost. The refractive element may be planarly formed on a wafer to integrate with a photonic integrated circuit. Multiple refractive elements having different filter ranges can be formed in one fabrication process by varying the periodic structures in the respective refractive element. A refractive element may be integrated with an active element to tune the refraction or the filter range of the refractive element.

Other implementations of this and other aspects include corresponding systems, apparatus, and computer programs, configured to perform the actions of the methods, encoded on computer storage devices. A system of one or more computers can be so configured by virtue of software, firmware, hardware, or a combination of them installed on the system that in operation cause the system to perform the actions. One or more computer programs can be so configured by virtue of having instructions that, when executed by data processing apparatus, cause the apparatus to perform the actions.

The details of one or more implementations are set forth in the accompanying drawings and the description below.

BRIEF DESCRIPTION OF THE DRAWINGS

FIGS. 1B, 1C, and 1D show examples of a refractive element.

FIG. 1E shows an example of cascaded refractive elements.

FIGS. 3A-3D show examples of a periodic structure pattern.

FIGS. 5A-5D show examples of a refractive element having a stress-induced curvature.

FIGS. 6A-6D show examples of a refractive element integrated with doped regions.

Like reference numbers and designations in the various drawings indicate like elements. It is also to be understood that the various exemplary embodiments shown in the figures are merely illustrative representations and are not necessarily drawn to scale.

DETAILED DESCRIPTION

Figure 1A:
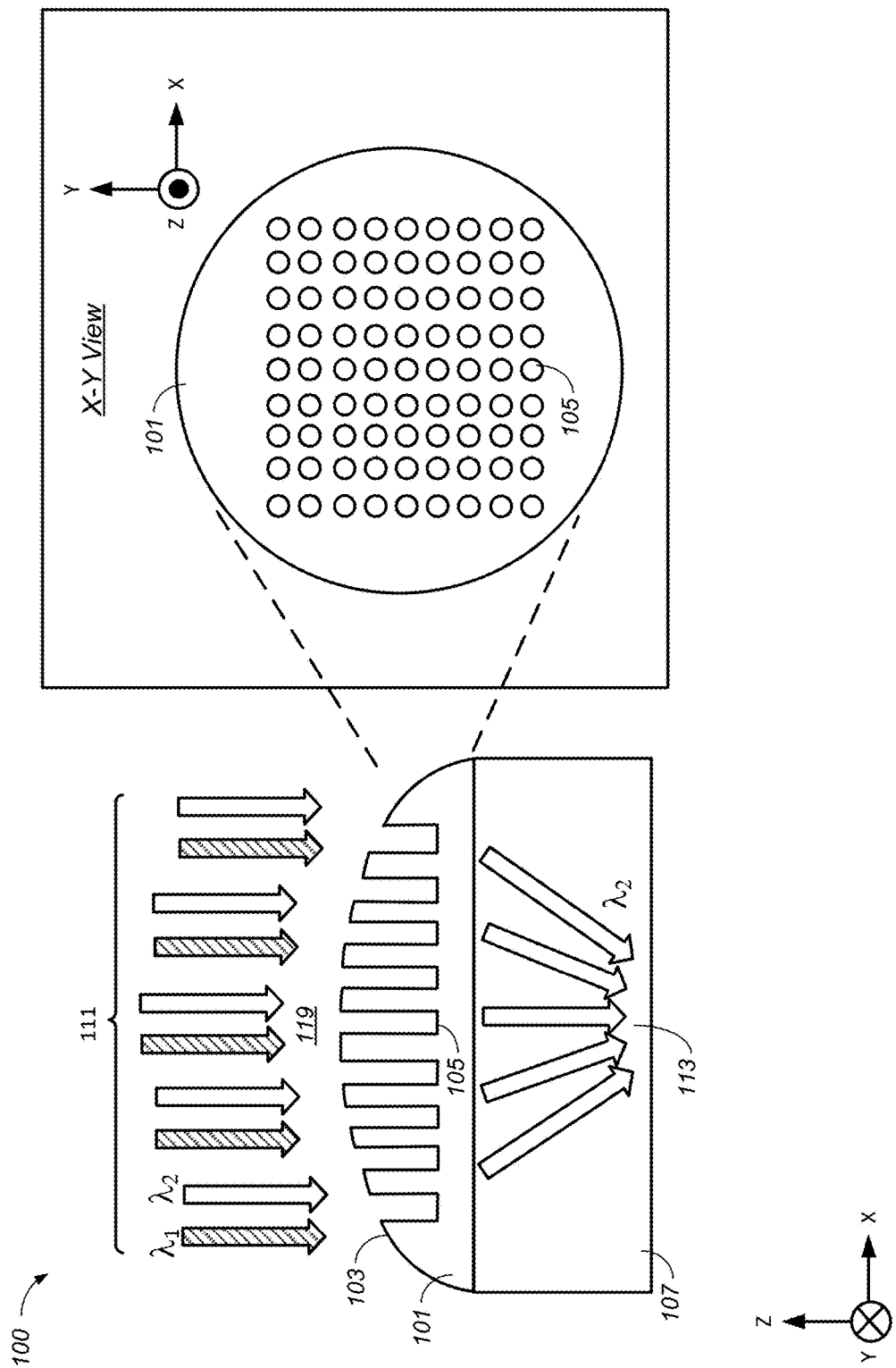
FIG. 1A shows an example of a photonic integrated circuit.

FIG. 1A is a block diagram of an example photonic integrated circuit 100 that includes a refractive element for enabling the coupling of light into and out of a photonic integrated circuit 100. In general, an optical element may be associated with one or more optical specification parameters. In some implementations, an optical specification parameter may be a numerical aperture that allows the optical element to capture a cone of light within a specific angle. For example, a single-mode fiber may be associated with a numerical aperture of 0.14. In some implementations, an optical specification parameter may be a specific size that allows the optical element to transmit or receive light. For example, an optical detector may have a detector area of 100 µm$^2$ for receiving light. Light transmitted from one optical element to another optical element with a mismatch in optical specification parameters typically results in a loss in optical power. To reduce loss, a lens may be used to reduce the mismatch in the optical specification parameters between two optical elements. For example, a lens may be used to match the numerical aperture between two optical elements. As another example, a lens may be used to focus light to an optical element having a smaller area. Moreover, light propagating in an optical system may be associated with multiple wavelengths, and a filter may be used between optical elements to select one or more target wavelengths from the multi-wavelength light. It may be desirable to integrate a lens or a filter with other optical element to reduce integration complexity and fabrication cost. It may also be desirable to integrate a lens and a filter into one refractive element to reduce integration complexity and fabrication cost.

The photonic integrated circuit 100 includes a refractive element 101 and an optical medium 107. In general, the refractive element 101 is formed to refract and/or filter light either from an external medium 119 to the optical medium 107, or from the optical medium 107 to the external medium 119. As an example, an input light 111 having two wavelengths $\lambda_1$ and $\lambda_2$ enters the refractive element 101, where the wavelength $\lambda_1$ is filtered out by the refractive element 101, and the wavelength $\lambda_2$ is selected and focused by the refractive element 101 as a focused light beam 113 in the optical medium 107. Note that this example is not limiting, and the refractive element 101 may be designed to select or filter one or more other wavelengths, or may be designed to perform other optical functions such as defocusing or collimating of a light beam.

In general, the refractive element 101 may include a surface 103 and a group of periodic structures 105. The surface 103 has a predetermined radius of curvature and its surface curvature may be configured to refract the incident light beam according to Snell's law or any suitable numerical analysis models. Examples of a numerical analysis model include a ray tracing model, a Gaussian beam model, a beam propagation method (BPM) model, a Fourier beam propagation model, or a finite-difference time-domain (FDTD) model.

The group of periodic structures 105 may include a group of one-dimensional, two-dimensional, three-dimensional, or a combination of periodic structures that are configured to refract or to filter incident light. In the example shown in FIG. 1A, a group of two-dimensional periodic structures 105 are formed in the refractive element 101. As used in this specification, periodic structures may include photonic crystals, gratings, or other periodic structures that affect an optical property of light coupled to the periodic structures. Additional examples of periodic structures 105 are described in more details in FIGS. 3A to 3D.

In some implementations, the group of periodic structures 105 may be configured to refract or to filter light according to a guided mode resonance effect. In a guided mode resonance effect, the group of periodic structures 105 is formed with a material having a higher refractive index than the bulk of the refractive element 101, the optical medium 107, and the external medium 119 to produce at least a guided mode in the group of periodic structures 105. The guided mode interferes with a diffraction mode of the group of periodic structures 105 to yield a resonance response that can be used as a filter. In some implementations, a combination of the curved surface 103 and the resonance response may refract light in different directions. In some implementations, the period of the periodic structures 105 according to a guided mode resonance effect may be in the dimension of sub-wavelength.

In some implementations, the group of periodic structures 105 may be configured to refract or to filter light according to an effective index change effect. In an effect index change effect, the group of periodic structures 105 is designed to produce a varying effective index profile along an axis of the refractive element 101. For example, the group of periodic structures 105 may vary in hole diameters and/or in periodicity along the x and y axes to yield a varying effective index profile. In some implementations, a combination of the curved surface 103 and the varying effective index profile may refract light in different directions. In some implementations, a combination of the curved surface 103 and the varying effective index profile may cause a joint phase shift effect of the refracted light to yield an optical focuser/defocuser. In some implementations, the period of the periodic structures 105 according to an effective index change effect may be in the dimension of deep sub-wavelength.

In some implementations, to reduce or to eliminate the polarization effect of the input light 111, the group of periodic structures 105 may be arranged to possess a 90 degree rotational symmetry around its optical axis. In this example, the optical axis is along the z-axis at the center of the refractive element 101.

The optical medium 107 may be any medium that can transmit, guide, detect, or generate light. For example, the optical medium 107 may be a semiconductor substrate such as silicon, oxide, nitride or their combinations. As another example, the optical medium 107 may be air. As another example, the optical medium 107 may be a germanium photodetector that absorbs light. As another example, the optical medium 107 may be a multi-layer vertical-cavity surface-emitting laser (VCSEL).

An external medium 119 may be any medium that can transmit, guide, detect, or generate light. For example, the external medium 119 may be an optical fiber. As another example, the external medium 119 may be a photo-detector. As another example, the external medium 119 may be a light source. As another example, the external medium 119 may be air. As another example, the external medium 119 may be a semiconductor substrate such as silicon, oxide, nitride or their combinations. In some implementations, a cladding layer composed of one or more layers of nitride, oxide, air, or an organic material, may be formed between the external medium 119 and the refractive element 101.

In some implementations, the refractive element 101 and the optical medium 107 may be composed of different materials. For example, the refractive element 101 may be composed of silicon, and the optical medium 107 may be composed of oxide. In some implementations, the refractive element 101 and the optical medium 107 may be the same material. For example, the refractive element 101 and the optical medium 107 may be composed of germanium or other III-V compounds. In some implementations, the refractive element 101 may be composed of multiple layers of materials. FIGS. 1C and 1D describe examples of a multi-layer refractive element. In some implementations, the optical medium 107 may be composed of multiple layers of materials. For example, multi-layer anti-reflection coating may be deposited to minimize the reflection between the refractive element 101 and the optical medium 107. In some implementations, the refractive element may function as a filter, a focuser/defocuser, or both.

Figure 1B:
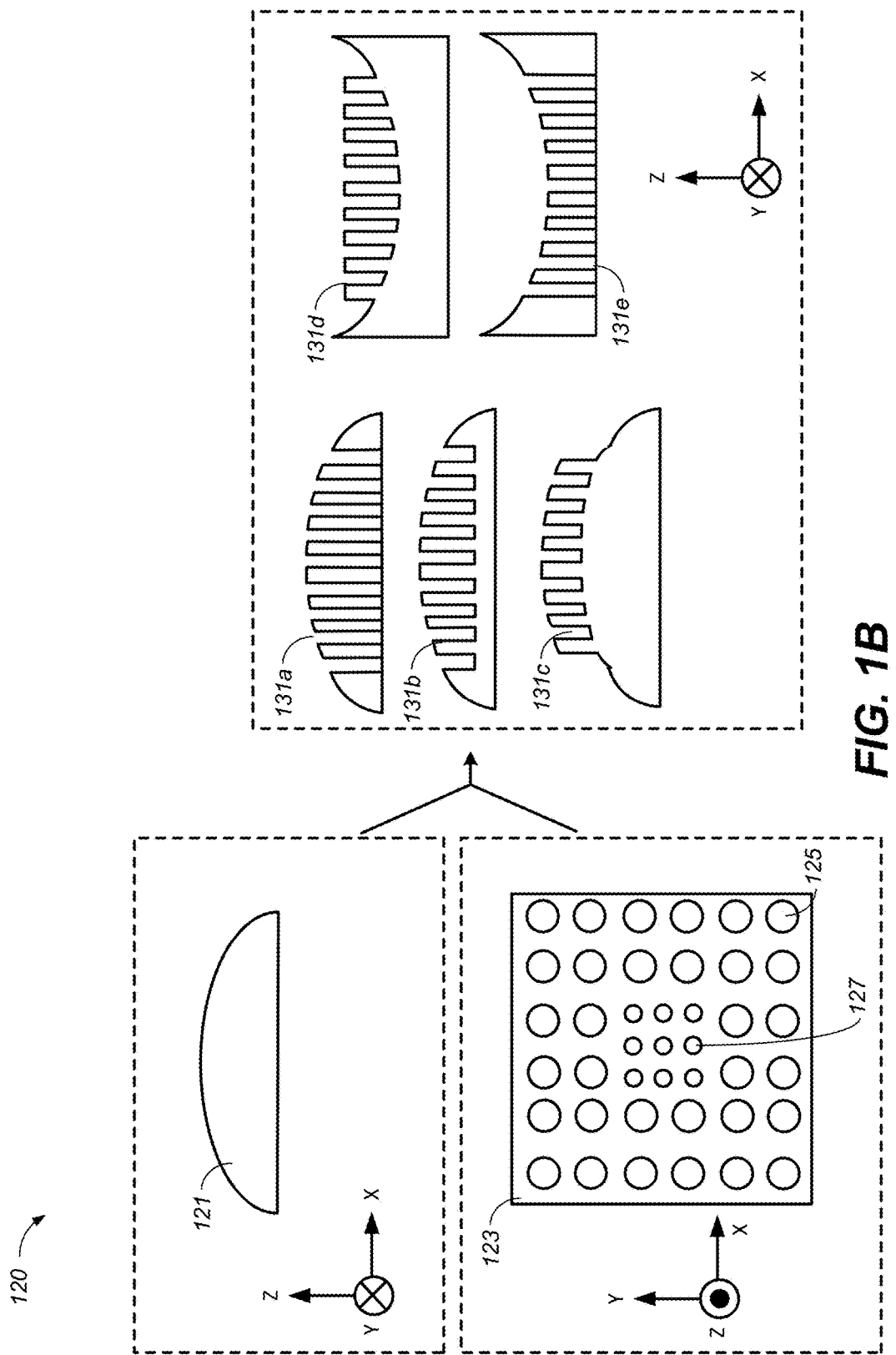

FIG. 1B shows examples of refractive elements 131a-131e that may be implemented as a refractive element 101 in the photonic integrated circuit 100. Any one of the refractive elements 131a-131e may also be implemented in any one of the other photonic integrated circuits described throughout this application, or in another photonic integrated circuit not described in this application.

Conceptually, a refractive element may be separated into a lens portion 121 and a periodic structure portion 123. In general, light incident on a surface of the lens portion 121 is refracted by the surface having a predetermined radius of curvature. In some implementations, the surface curvature may be induced by an intentional or non-intentional process strain induced, where the radius of curvature is significantly larger relative to the dimension of the refractive element. In some implementations, the surface may be patterned and etched using a grayscale mask to form a surface curvature.

Generally, the periodic structure portion 123 may include one or more groups of one-dimensional, two-dimensional, three-dimensional periodic structures. For example, the periodic structure portion 123 shown in FIG. 1B includes a first group of periodic structures 125 and a second group of periodic structures 127. The first group of periodic structures 127 may be designed to produce an effective index change effect. The second group of periodic structures 125 may be designed to produce a guided mode resonance effect. In some implementations, a superposition of the first group of periodic structures 125 and the second group of periodic structures 127 yields a periodic structure portion 123 that both refracts and filters incident light.

The lens portion 121 and the periodic structure portion 123 may be combined to form a refractive element. For example, a refractive element 131a may be formed by etching the periodic structure portion to the bottom of the lens portion to provide a higher index contrast between the periodic structure portion and the lens portion. As another example, if the lens portion has a convex surface, a refractive element 131b may be formed by etching the periodic structures such that peaks of the periodic structures follow the curvature of the lens portion. The refractive element 131b may be formed by etching the periodic structures after forming the lens portion. As another example, if the lens portion has a convex surface, a refractive element 131c may be formed by etching the periodic structures such that peaks of the periodic structures follow the curvature of the lens portion. The refractive element 131c may be formed by etching the inverse pattern of the periodic structures after forming the lens portion.

As another example, if the lens portion has a concave surface, a refractive element 131d may be formed by etching the periodic structures such that valleys of the periodic structures follow the curvature of the lens portion. The refractive element 131d may be formed by etching the periodic structures before forming the lens portion. As another example, if the lens portion has a concave surface, a refractive element 131e may be formed by etching the periodic structures such that peaks of the periodic structures follow the curvature of the lens portion. The refractive element 131e may be formed by etching the periodic structures after forming the lens portion.

In some implementations, to filter, focus, or defocus one or more wavelengths of an incident light, one or more periodic structures of the group of periodic structures may be filled with a material having a different refractive index from an effective refractive index of the refractive element. For example, a refractive element may be composed of silicon, where the group of periodic structures are at least partially filled with oxide or nitride. In some implementations, to filter, focus, or defocus one or more wavelengths of an incident light, one or more periodic structures of the group of periodic structures may be formed to have a different radius from a radius of one or more other periodic structures of the group of periodic structures. For example, the periodic structures 125 have a different radius from a radius of the periodic structures 127. In some implementations, to filter, focus, or defocus one or more wavelengths of an incident light, a plurality of periodic structures of the group of periodic structures may be formed with a locally non-uniform period.

FIG. 1C shows an example of a multi-layer refractive element 140 that may be implemented in the photonic integrated circuit 100. Note that although not shown here, the multi-layer refractive element 140 may include a curved surface. The multi-layer refractive element 140 includes three layers 141, 143, and 145. In some implementations, the layers 141, 143, and 145 may be composed of a combination of different materials, such as dielectric (e.g., oxide, nitride, polymer, or air), semiconductor (e.g., silicon, germanium, or III-V materials), or metal (e.g., aluminum, tungsten, or other metals). For example, one or more of the three layers 141, 143, and 145 may be composed of an absorption material such as germanium. As another example, two or more of the three layers 141, 143, and 145 may be composed of a gain material such as III-V materials. Periodic structures may be formed on the top layer 145, where the two other layers 141 and 143 may be formed to provide a surface strain on the top layer 145 to form the surface curvature of the multi-layer refractive element 140. In some other implementations, the multi-layer refractive element 140 may include fewer or more layers. In some other implementations, the periodic structures may be formed on more than one layers.

FIG. 1D shows an example of a multi-layer refractive element 150 that may be implemented in the photonic integrated circuit 100. Note that although not shown here, the multi-layer refractive element 150 may include a curved surface. The multi-layer refractive element 150 includes three layers 151, 153, and 155. The layers 151, 153, and 155 may be composed of a combination of different materials, such as dielectric (e.g., oxide, nitride, polymer, or air), semiconductor (e.g., silicon, germanium, or III-V materials), or metal (e.g., aluminum, tungsten, or other metals). For example, one or more of the three layers 151, 153, and 155 may be composed of an absorption material such as germanium. As another example, two or more of the three layers 151, 153, and 155 may be composed of a gain material such as III-V materials. In some implementations, periodic structures may be formed on the layer 153 between the two other layers 151 and 155. For example, the layer 153 may be a material with a higher refractive index than the layers 151 and 155 to produce a guide mode resonance effect in the multi-layer refractive element 150. In some other implementations, the multi-layer refractive element 150 may include fewer or more layers. In some other implementations, the periodic structures may be formed on more than one layers.

FIG. 1E shows an example of cascaded refractive elements 160. In general, the cascaded refractive elements 160 enable further design flexibilities. For example, the cascaded refractive elements 160 may include a first refractive element 161 and a second refractive element 163 that is optically coupled to the first refractive element 161. The first refractive element 161 may be designed to filter a wavelength range of 1550 nm to 1555 nm, and the second refractive element 163 may be designed to filter a wavelength range of 1554 nm to 1559 nm. By cascading the first refractive element 161 with the second refractive element 163, a narrower filter of a wavelength range of 1554 nm to 1555 nm may be obtained. Each of the first refractive element 161 and the second refractive element 163 may be implemented using any of the refractive elements described in this application. In some implementations, the first refractive element 161 can be operated under an effective index change effect to change the optical beam profile and the second refractive element 163 can be operated under a guided mode resonance effect to select desired wavelengths. In some implementations, an effective refractive index of the second refractive element 163 is different from an effective refractive index of the first refractive element 161. In some other implementations, an effective refractive index of the second refractive element 163 is equal to an effective refractive index of the first refractive element 161. In some implementations, the second refractive element 163 includes a second group of periodic structures that are different from the first group of periodic structures of the first refractive element 161. In some other implementations, the second refractive element 163 includes a second group of periodic structures that are equal in dimensions as the first group of periodic structures of the first refractive element 161. In some implementations, one refractive element may be a filter while the other refractive element may be a focuser or defocuser.

Figure 2A:
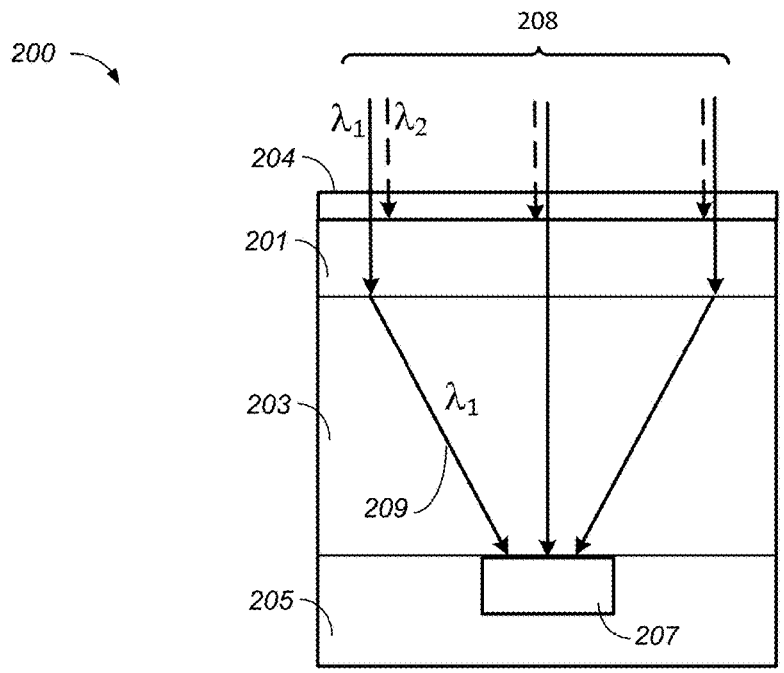
FIGS. 2A and 2B show block diagrams of examples of a photonic integrated circuit for filtering and focusing light.

FIG. 2A shows a block diagram of an example of a photonic integrated circuit 200 that integrates a refractive element with an active element. In this example, input light 208 having two wavelengths $\lambda_1$ and $\lambda_2$ are incident on the photonic integrated circuit 200, where one wavelength $\lambda_1$ is transmitted as light 209 and the other wavelength $\lambda_2$ is filtered out. The light 209 is focused to a photodetector for an optical power measurement of the wavelength $\lambda_1$.

The photonic integrated circuit 200 includes a refractive element 201, an optical medium 203, a cladding element 204, a substrate 205, and an active element 207. The refractive element 201 may be implemented using any of the refractive elements described in this application. For example, the refractive element 201 may be implemented using the refractive element 101 as described in FIG. 1A. Here, the refractive element 201 is configured to focus the input light 208 to the active element 207. In addition, the refractive element 201 is configured to reject one or more wavelengths including $\lambda_2$.

The optical medium 203 may be composed of a material that is transmissive or partially transmissive to the light 209. In some implementations, the thickness of the optical medium 203 may be the focal length of the refractive element 101. In some implementations, the thickness of the optical medium 203 may be a length that yields a specific spot size on the active element 207.

The cladding element 204 is formed over the refractive element 201 to reduce reflection of the input light 208 and/or to provide protection to the refractive element 201. In some implementations, an effective refractive index of the cladding element 204 is lower than an effective refractive index of the refractive element 201. In some implementations, the cladding element 204 may be composed of one or more layers of nitride, oxide, air, or an organic material.

The substrate 205 may be any type of substrate that is suitable for fabricating a photonic integrated circuit. For example, the substrate 205 may be a silicon wafer, a silicon-on-insulator (SOI) wafer, a III-V material such as a gallium arsenide (GaAs) or an indium phosphide (InP) wafer, a flexible organic substrate, a quartz wafer, or a glass wafer. As another example, the substrate 205 may be a layer of passive or active material deposited over an integrated electronic circuit.

The active element 207 may be an optical component that transmits, modulates, switches, or absorbs light. In this example, the active element 207 is a photodetector configured to absorb at least a portion of the light 209 to measure the optical power of the wavelength $\lambda_1$. In some implementations, the active element 207 may be composed of one or more layers of silicon, germanium, tin, or III-V compounds.

Figure 2B:
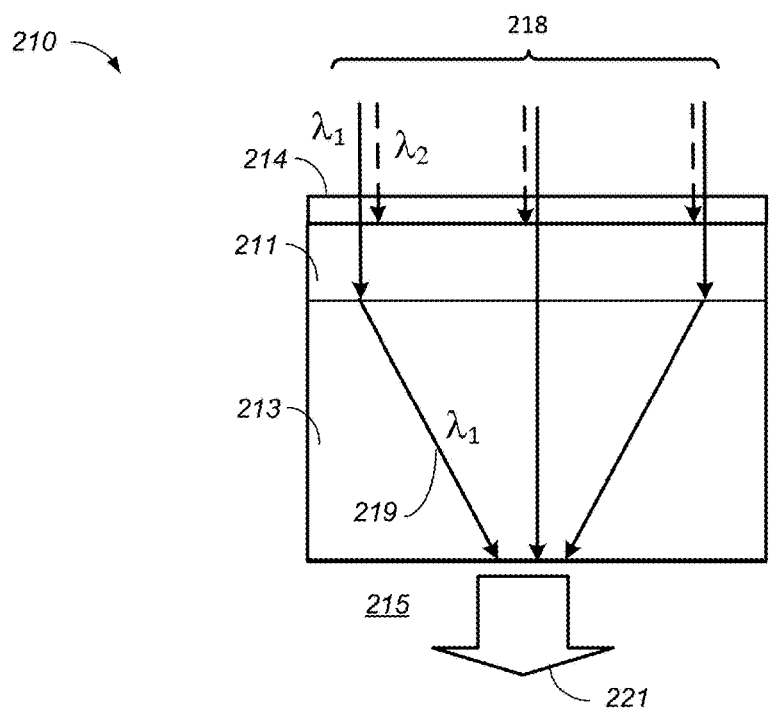

FIG. 2B shows a block diagram of an example of a photonic integrated circuit 210 for guiding light. In this example, input light 218 having two wavelengths $\lambda_1$ and $\lambda_2$ are incident on the photonic integrated circuit 210, where one wavelength $\lambda_1$ is transmitted as light 219 and the other wavelength $\lambda_2$ is filtered out. The light 219 is focused in an optical medium and then is transmitted out of the photonic integrated circuit 210 as light 221. The light 221 may be guided to another optical device or another optical system for further processing.

The photonic integrated circuit 210 includes a refractive element 211, an optical medium 213, a cladding element 214, and an external medium element 215. The refractive element 211 may be implemented using any of the refractive elements described in this application. For example, the refractive element 211 may be implemented using the refractive element 150 as described in FIG. 1D. Here, the refractive element 211 is configured to focus the input light 218. In addition, the refractive element 211 can also be configured to reject one or more wavelengths including $\lambda_2$.

The optical medium 213 may be implemented using any of the optical medium described in this application. For example, the optical medium 213 may be implemented using the optical medium 203 as described in FIG. 2A. The cladding element 214 may be implemented using any of the cladding elements described in this application. For example, the cladding element 214 may be implemented using the cladding element 204 as described in FIG. 2A. The external medium 215 may be implemented using any of the external medium described in this application. For example, the external medium 215 may be implemented using the external medium 119 as described in FIG. 1A. In some implementations, an effective refractive index of 214 is higher than an effective refractive index of the refractive element 211.

FIG. 3A shows an example of a view of a group of periodic structures 331 on a plane along the x-y dimensions. The descriptions of FIG. 3A may be applied to any one of the refractive elements described in this application. The group of periodic structures 331 includes an array of one-dimensional periodic structures 301a-n and 303a-n along the x direction, where n is any integer greater than one. An example of the group of periodic structures may be a one-dimensional grating or a one-dimensional photonic crystals. In some implementations, the group of periodic structures 301a-n and 303a-n may be composed of different materials. For example, the periodic structures 301a-n may be composed of silicon, and the periodic structures 303a-n may be composed of oxide. As another example, the periodic structures 303a-n may include a layer of semi-transparent metal such as ITO, that forms surface plasmonic effect. The arrangement of 301a, 303a, 301b, 303b, . . . , 301n, and 303n forms the group of periodic structures of a refractive element.

FIG. 3B shows an example of a view of a group of periodic structures 332 on a plane along the x-y dimensions. The descriptions of FIG. 3B may be applied to any one of the refractive elements described in this application. The group of periodic structures 332 includes a two-dimensional periodic structure 305a and the layer 305b. In some implementations, the periodic structures 305a may be grating peaks of a grating. In some other implementations, the periodic structures 305a may be grating valleys of a grating. The arrangement of 305a forms the group of periodic structures of a refractive element. In some implementations, the layer 305b can be oxide and periodic structures 305a can be silicon.

FIG. 3C shows an example of a view of a group of periodic structures 333 on a plane along the x-y dimensions. The descriptions of FIG. 3C may be applied to any one of the refractive elements described in this application. The group of periodic structures 333 includes an array of two-dimensional rectangular periodic structure 307a to 307n along the x direction, and 307a to 307k along the y direction. In some implementations, the periodic structure 307a may be a peak of a grating or a photonic crystal. In some other implementations, the periodic structure 307a may be a valley of a grating or a photonic crystal. In some implementations, the periodic structure 307a may be composed of the same material as the layer 308, such as silicon. In some implementations, the periodic structure 307a may be composed of a different material from the layer 308. For example, the periodic structure 307a may be composed of silicon, and the layer 308 may be composed of oxide or nitride. In some implementations, the periodic structure 307a may be a square, a circle, a non-square, or combinations of different structures. The arrangement of the periodic structures 307a-n and 307a-k on the x-y plane forms the periodic structure in a refractive element. In some implementations, the period of the periodic structures along the x direction 321 and period of the periodic structures along the y direction 322 substantially match an interference pattern in the layer 308 along the x and y directions under a guided mode resonance effect.

FIG. 3D shows an example of a view of a group of periodic structures 334 on a plane along the x-y dimensions. The descriptions of FIG. 3D may be applied to any one of the refractive elements described in this application. The group of periodic structures 334 includes an array of two-dimensional arbitrary-shaped periodic structures 309a to 309n, where n is any integer greater than one. In some implementations, the arbitrary-shaped periodic structure 309a may be a peak of a grating or a photonic crystal. In some other implementations, the arbitrary-shaped periodic structure 309a may be a valley of a grating or a photonic crystal. In some implementations, the arbitrary-shaped periodic structure 309a may be composed of a different material from the layer 310. For example, the arbitrary-shaped periodic structure 309a may be composed of silicon-dioxide, and the layer 310 may be composed of silicon. In some implementations, the arbitrary-shaped periodic structure 309a may be a triangle, a circle, an ellipse, or combinations of different shapes. The arrangement of the arbitrary-shaped periodic structure 309a-n on the x-y plane forms the group of periodic structures of a refractive element. In some implementations, the shape, relative distance of any one of the arbitrary-shaped periodic structures 309a to 309n may be determined using numerical analysis. For example, a Finite-difference time-domain (FDTD) analysis program may be used to design the shape of each of the arbitrary-shaped periodic structure 309a to 309n.

Figure 4:
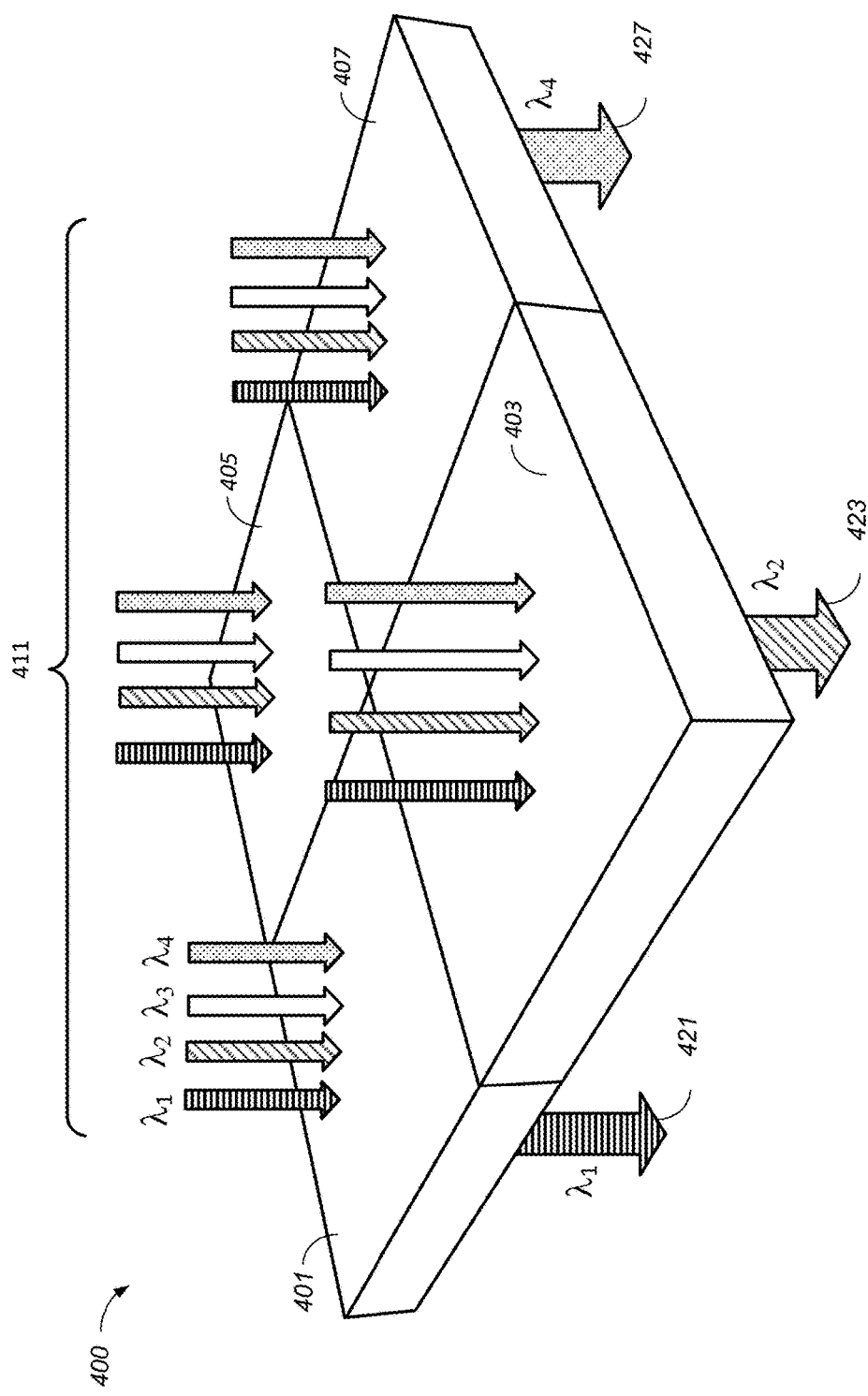
FIG. 4 shows an example of a photonic integrated circuit having multiple refractive elements for filtering different wavelengths of light.

FIG. 4 shows an example photonic integrated circuit 400 having multiple refractive elements for filtering different wavelengths of light. Briefly, multiple refractive elements may be formed over a single substrate, where each refractive element may be configured to filter a respective range of wavelengths, which is useful for separately monitoring optical powers of multiple wavelengths in wavelength-division multiplexing (WDM) or image/spectrum sensing applications. Additionally or alternatively, each refractive element may be formed to refract the respective range of wavelengths in a desired manner.

In this example, the photonic integrated circuit 400 includes a first refractive element 401, a second refractive element 403, a third refractive element 405, and a fourth refractive element 407, and can be fabricated by using semiconductor manufacturing methods such as lithography and etching. The first refractive element 401 is configured to refract and to pass a wavelength range that includes $\lambda_1$ but not $\lambda_2$, $\lambda_3$, or $\lambda_4$. The second refractive element 403 is configured to refract and to pass a wavelength range that includes $\lambda_2$ but not $\lambda_1$, $\lambda_3$, or $\lambda_4$. The third refractive element 405 is configured to refract and to pass a wavelength range that includes $\lambda_3$ but not $\lambda_1$, $\lambda_2$, or $\lambda_4$. The fourth refractive element 407 is configured to refract and to pass a wavelength range that includes $\lambda_4$ but not $\lambda_1$, $\lambda_2$, or $\lambda_3$. A wide spectrum light 411 that includes wavelengths $\lambda_1$, $\lambda_2$, $\lambda_3$, and $\lambda_4$ is incident on the photonic integrated circuit 400, and each of the first refractive element 401, the second refractive element 403, the third refractive element 405, and the fourth refractive element 407 filters out the respective wavelength for further processing. Note that in a different implementation, a different number of refractive elements may be formed in a photonic integrated circuit, where each of the refractive elements may not be configured to refract and/or filter a wavelength range as described in this example. In some implementations, the incident light 411 is a wide-spectrum signal wherein $\lambda_1$ covering red light spectrum, $\lambda_2$ covering green light spectrum, $\lambda_3$ covering blue light spectrum and $\lambda_4$ covering infrared spectrum. In some implementations, the photonic integrated circuit 400 can be viewed as an integrated spectrum filter, which is monolithically integrated with CMOS image sensors to reduce integration complexity and fabrication cost. Multiple refractive elements with different photonic crystal structures can be designed, fine-tuned for each targeted spectrum range, and then fabricated using the same lithography step. This allows finer spectrum filtering and more filters can be integrated with the sensors, and it means finer spectrum resolution for capturing more realistic image.

FIG. 5A shows an example a refractive element 500 having a compressive stress-induced curvature from a lattice or thermal expansion mismatch. The refractive element 500 includes a refractive element 501 and an optical medium 503. In general, when the optical medium 503 has a smaller lattice size than the refractive element 501, a compressive strain may be induced on the surface of the refractive element 501, and a convex curved surface may be formed. For example, the optical medium 503 may be composed of oxide, and the refractive element 501 may be composed of silicon. In some implementation, the convex curved surface may be used to partially focus the incident light.

FIG. 5B shows an example a refractive element 510 having a tensile stress-induced curvature from a lattice or thermal expansion mismatch. The refractive element 510 includes a refractive element 511 and an optical medium 513. In general, when the optical medium 513 has a larger lattice size than the refractive element 511, a tensile strain may be induced on the surface of the refractive element 511, and a concave curved surface may be formed. For example, the optical medium 513 may be composed of germanium, and the refractive element 511 may be composed of silicon. In some implementation, the concave curved surface may be used to partially defocus the incident light.

FIG. 5C shows an example a refractive element 520 having a compressive stress-induced curvature from sidewalls. The refractive element 520 includes a refractive element 521 and a sidewall 523 surrounding at least a part of the circumference of the refractive element 521. When a compressive strain may be induced on the surface of the refractive element 521, and a convex curved surface may be formed. For example, the sidewall 523 may be composed of thermal oxide or dense nitride, and the refractive element 521 may be composed of silicon. In some implementation, the convex curved surface may be used to partially focus the incident light.

FIG. 5D shows an example a refractive element 530 having a tensile stress-induced curvature from sidewalls. The refractive element 530 includes a refractive element 531 and a sidewall 533 surrounding at least a part of the circumference of the refractive element 531. When a tensile strain may be induced on the surface of the refractive element 531, and a concave curved surface may be formed. For example, the sidewall 533 may be composed of porous oxide or nitride, and the refractive element 531 may be composed of silicon. In some implementation, the concave curved surface may be used to partially defocus the incident light.

FIG. 6A shows an example of a photonic integrated circuit 600 showing a modulation element having two doped regions and coupled to a refractive element by being at least partially embedded in the refractive element or integrated with the refractive element. Briefly, an effective refractive index of a refractive element may be modulated by a depletion or injection of free carriers from doped regions of the refractive element. The modulation of the effective refractive index of the refractive element changes the filter response and/or the refractive property of the refractive element. In some implementations, the modulation element is configured to change a direction of at least a portion of an incident light exiting the refractive element, a depth of focus of an incident light exiting the refractive element, or a selection of one or more wavelengths filtered by the group of periodic structures of the refractive element. The photonic integrated circuit 600 includes a refractive element 601. The refractive element 601 may include a group of periodic structures implemented using any of the refractive elements described in this application. In some implementations, the refractive element 601 may include a curved surface. In addition, the refractive element 601 includes a first doped region 602 and a second doped region 604. For example, the first doped region 602 may be a p-doped region, and the second doped region 604 may be an n-doped region, forming a p-n junction in the refractive element 601. In some implementations, with an application of a reverse bias voltage to the p-n junction, carriers are depleted from the junction region and the effective refractive index of the refractive element 601 is changed accordingly. In some implementations, with an application of a forward bias voltage to the p-n junction, carriers are injected into the junction region and the effective refractive index of the refractive element 601 is changed accordingly.

FIG. 6B shows an example of a photonic integrated circuit 610 showing a refractive element integrated with a modulation element having three doped regions. Briefly, an increase in a number of doped regions increases the number of depletion regions in a refractive element, and therefore increases the volume that the refractive index change occurs. The photonic integrated circuit 610 includes a refractive element 611. The refractive element 611 may include a group of periodic structures implemented using any of the refractive elements described in this application. In some implementations, the refractive element 611 may include a curved surface. In addition, the refractive element 611 includes a first doped region 612, a second doped region 614, and a third doped region 616. As an example, the first doped region 612 may be a p-doped region, the second doped region 614 may be an n-doped region, and the third doped region 614 may be a p-doped region, forming a p-n-p junction in the refractive element 611. As another example, the first doped region 612 may be an n-doped region, the second doped region 614 may be a p-doped region, and the third doped region 614 may be an n-doped region, forming a n-p-n junction in the refractive element 611. As an example, the first doped region 612 may be a p-doped region, the second doped region 614 may be an intrinsic region, and the third doped region 614 may be an n-doped region, forming a p-i-n junction in the refractive element 611. In some implementations, with an application of forward or reverse bias voltages, carriers are injected and/or depleted in the junction regions in the refractive element 611, and the effective refractive index of the refractive element 611 is changed accordingly.

FIG. 6C shows an example of a photonic integrated circuit 620 showing a refractive element integrated with a modulation element having interdigitated doped regions. Briefly, interdigitated doped regions may be desirable when a diameter of the refractive element is much larger than one depletion region created by a p-n junction. By forming interdigitated doped regions throughout the refractive element, a larger overall change in the effective refractive index may be obtained. The photonic integrated circuit 620 includes a refractive element 621. The refractive element 621 may include a group of periodic structures implemented using any of the refractive elements described in this application. In some implementations, the refractive element 621 may include a curved surface. In addition, the refractive element 621 includes interdigitated doped regions 622a to 622n, where n is an integer. As an example, the interdigitated doped regions 622a to 622n may have alternating p and n doping, forming a p-n-p-n-p- . . . junction in the refractive element 621. As another example, the interdigitated doped regions 622a to 622n may have alternating p, intrinsic, and n doping, forming a p-i-n-p-i-n-p- . . . junction in the refractive element 621. In some implementations, with an application of reverse bias voltages, carriers are depleted from multiple depletion regions in the refractive element 621, and the effective refractive index of the refractive element 621 is changed accordingly. In some implementations, with an application of forward bias voltages, carriers are injected into multiple depletion regions in the refractive element 621, and the effective refractive index of the refractive element 621 is changed accordingly.

FIG. 6D shows an example of a photonic integrated circuit 630 showing an optical medium integrated with a modulation element having multiple doped regions. Briefly, an effective refractive index of an optical medium may be modulated by a depletion of injection of free carriers. The modulation of the effective refractive index of the optical medium changes the refractive property of the light exiting the refractive element. The photonic integrated circuit 630 includes a refractive element 631 formed on an optical medium 633. The refractive element 631 may include a group of periodic structures implemented using any of the refractive elements described in this application. In some implementations, the refractive element 631 may include a curved surface. The optical medium 633 includes a first doped region 635 and a second doped region 637. For example, the first doped region 635 may be a p-doped region, and the second doped region 637 may be an n-doped region, forming a p-n junction in the optical medium 633. In some implementations, with an application of a reverse bias voltage to the p-n junction, carriers are depleted from the junction region and the effective refractive index of the optical medium 633 is changed accordingly. In some implementations, with an application of a forward bias voltage to the p-n junction, carriers are injected into the junction region and the effective refractive index of the optical medium 633 is changed accordingly.

Figure 7A:
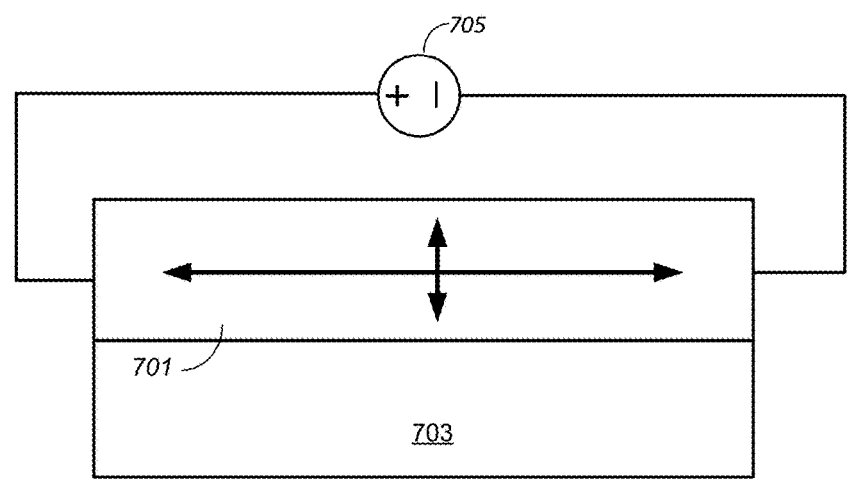
FIGS. 7A-7B show examples of a refractive element controlled by a piezoelectric effect.

FIG. 7A shows an example of a photonic integrated circuit 700 showing a refractive element controlled by a piezoelectric effect. In general, in a piezoelectric material, an application of a voltage exerts a mechanical force to change a shape of the piezoelectric material. In this example, the photonic integrated circuit 700 includes an optical medium 703, a refractive element 701 formed on the optical medium 703, and a voltage source 705 coupled to the refractive element 701. The refractive element 701 may include a group of periodic structures implemented using any of the refractive elements described in this application. In some implementations, the refractive element 701 may include a curved surface. In addition, the refractive element 701 may include a piezoelectric material. In some implementations, an application of voltage using the voltage source 705 may exert a mechanical force in the refractive element 701 to change the predetermined radius of curvature of the surface of the refractive element 701. In some implementations, an application of voltage using the voltage source 705 may exert a mechanical force in the refractive element 701 to change the radius or period of the photonic crystal structures of the refractive element 701.

Figure 7B:
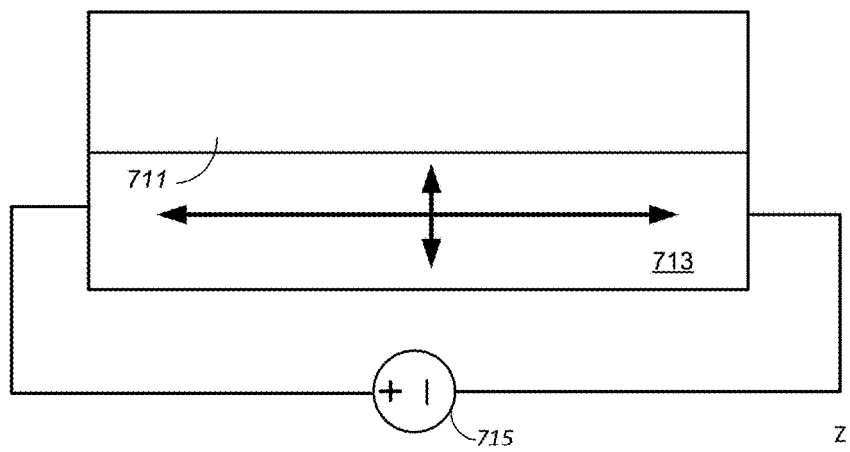

FIG. 7B shows an example of a photonic integrated circuit 710 showing a refractive element controlled by a piezoelectric effect. In this example, the photonic integrated circuit 710 includes an optical medium 713, a refractive element 711 formed on the optical medium 713, and a voltage source 715 coupled to the optical medium 713. The refractive element 711 may include a group of periodic structures implemented using any of the refractive elements described in this application. In some implementations, the refractive element 711 may include a curved surface. The optical medium 713 may include a piezoelectric material. In some implementations, an application of voltage using the voltage source 715 may exert a mechanical force in the optical medium 713, which induces a change in the predetermined radius of curvature of the surface of the refractive element 711 formed on top of the optical medium 713. In some implementations, an application of voltage using the voltage source 715 may exert a mechanical force in the optical medium 713, which induces a change of the optical path length when the light is traveling substantially along the z-axis inside the optical medium 713.

Figure 8A:
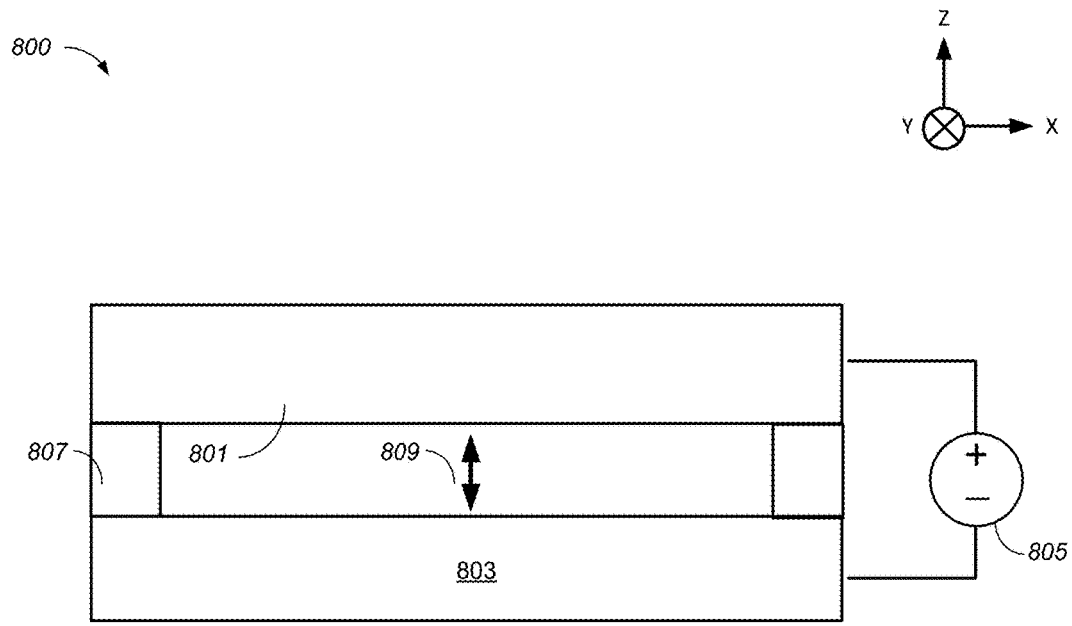
FIGS. 8A-8B show examples of a refractive element controlled by a capacitive effect.

FIG. 8A shows an example of a photonic integrated circuit 800 showing a refractive element controlled by a capacitive effect. In general, using a Micro-Electro-Mechanical System (MEMS), an application of an electric field between a refractive element and an optical medium may generate electrostatic force which causes a change in a position of the refractive element relative to the optical medium. In this example, the photonic integrated circuit 800 includes an optical medium 803, a refractive element 801, a supporting element 807, and a voltage source 805 coupled to the refractive element 801 and the optical medium 803. The refractive element 801 may include a curved surface or a group of periodic structures implemented using any of the refractive elements described in this application. In addition, the refractive element 801 and the optical medium 803 may act as two electrodes of a capacitor and generate an electrostatic force between the refractive element 801 and the optical medium 803 with an application of an external electric field by the voltage source 805. As an example, positive charges may accumulate at the bottom of the refractive element 801 and negative charges may accumulate at the top of the optical medium 803, forming an electrostatic force acting to change the distance between the refractive element 801 and the optical medium 803. Since the supporting element 807 supports at least the two ends of the refractive element 801, the electrostatic force causes a change in a position of the refractive element relative to the optical medium, as indicated by an arrow 809. In some implementations, the change in the position may be used to adjust the optical path of the focused beam exiting the refractive element 801. In some implementations, an application of voltage using the voltage source 805 may change the radius/period of the photonic crystal structures or a predetermined radius of curvature of the refractive element 801.

Figure 8B:
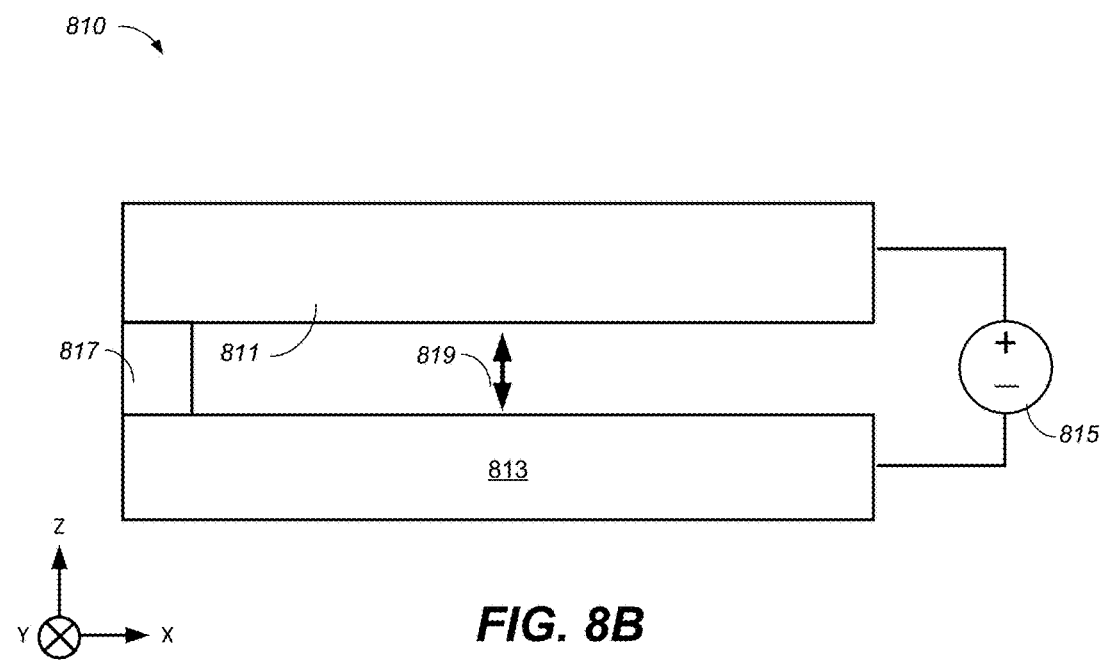

FIG. 8B shows an example of a photonic integrated circuit 810 showing a refractive element controlled by a capacitive effect. In general, using a Micro-Electro-Mechanical System (MEMS), an application of an electric field between a refractive element and an optical medium may generate electrostatic force which causes a change in an orientation of the refractive element relative to an optical axis of the incident light. In this example, the photonic integrated circuit 810 includes an optical medium 813, a refractive element 811, a supporting element 817, and a voltage source 815 coupled to the refractive element 811 and the optical medium 813. The refractive element 811 may include a curved surface or a group of periodic structures implemented using any of the refractive elements described in this application. As an example, positive charges may accumulate at the bottom of the tip of the refractive element 811 and negative charges may accumulate at the top of the optical medium 813 close to the tip of 811, forming an electrostatic force acting to change the distance between the refractive element 811 and the optical medium 813. Since the supporting element 817 supports only one end of the refractive element 811, the refractive element 811 may act as a cantilever. The electrostatic force causes a change in an orientation of the refractive element relative to an optical axis of the incident light, as indicated by an arrow 819. In some implementations, the change in the orientation may be used to adjust the incidence angle of the incident beam entering the refractive element 811. In some implementations, the change in the orientation may be used to adjust the emitting angle of the optical signal entering the refractive element 811 from the optical medium 813.

Figure 9:
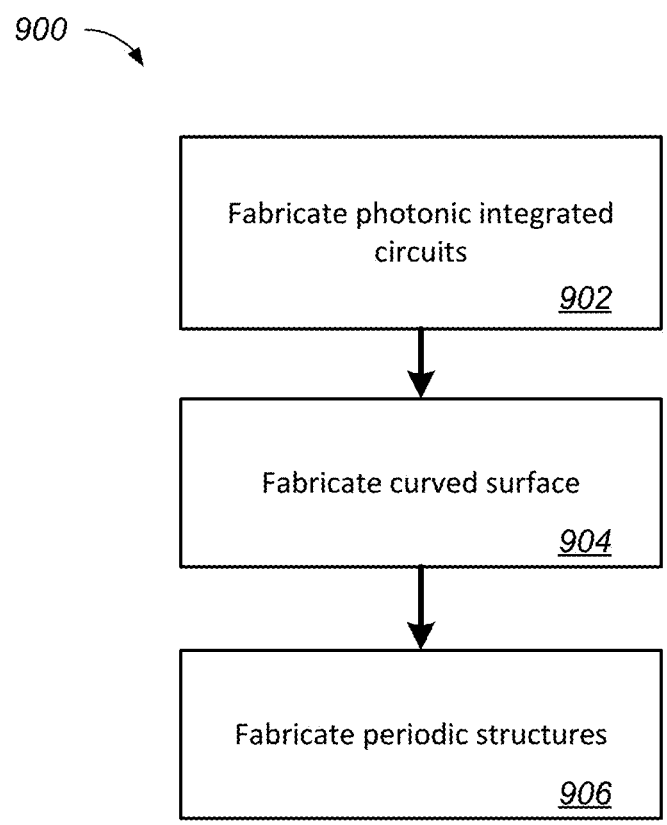
FIG. 9 shows an example of a flow diagram for fabricating a refractive element.

FIG. 9 shows an example of a flow diagram for fabricating a refractive element. The process flow 900 may occur in the illustrated sequence, or it may occur in a sequence that is different than in the illustrated sequence. Some of the steps in 900 may be optional. The process 900 may be performed by a system including data processing apparatus, such as one or more computers that control one or more apparatuses that perform the fabrication steps.

The system fabricates photonic integrated circuits (902). The fabrication of photonic integrated circuits may be done by a combination of CMOS compatible fabrication techniques. For example, lithography techniques such as projection lithography, electronic-beam lithography, contact lithography, or any other suitable lithography techniques may be used to pattern the photonic integrated circuits. As another example, etching techniques such as dry etching, wet etching, or any other suitable etching techniques may be used to etch the patterned photonic integrated circuits. As another example, thin film deposition techniques such as chemical vapor deposition, plasma-enhanced chemical vapor deposition, sputtering, or any other suitable thin film deposition techniques may be used to deposit one or more layers of materials on the photonic integrated circuits.

The system fabricates a surface curvature of a refractive element (904). In some implementations, the refractive element may be bonded to a layer formed on the substrate. For example, referring to FIG. 8A, the refractive element 801 may be bonded to the supporting element 807. In some implementations, the surface curvature may be formed using a grayscale mask. In some other implementations, the surface curvature may be induced by a process-related strain.

The system fabricates the periodic structures of the refractive element (906). In some implementations, the periodic structures may be filled with a material having a different refractive index from an effective refractive index of the refractive element. In some implementations, one or more periodic structures of the group of periodic structures may be formed to have a different radius from a radius of one or more other periodic structures of the group of periodic structures. In some implementations, a plurality of periodic structures of the group of periodic structures may be formed with a locally non-uniform period.

Optical filter is a key component to many applications such as optical communication, imaging, sensing and spectroscopy. Traditional filters commonly used such as thin-film filter and interference filter are incapable of having different physical properties at a different spatial location, which is an important feature for imaging applications.

The physical properties of guided-mode resonance (GMR) effect in a one-dimensional (1D) as an optical filter is an approach to enable the device having different physical properties at specific regions. In the literature, there are studies on GMR optical filters, but the 3 dB-bandwidths of these filters are usually less than 10 nm. Moreover, most of the GMR optical filters consist of 1D gratings so these devices are inherently polarization-dependent. Here, we use silicon photonic crystal (PC) slab to design a GMR optical filter at near-infrared (NIR) wavelengths. In the following sections, we will discuss the design procedures and present an exemplary structure that featuring ~20 nm 3 dB-bandwidth transmission band, which can find applications in coarse-wavelength division multiplexing (CWDM).

Figure 10:
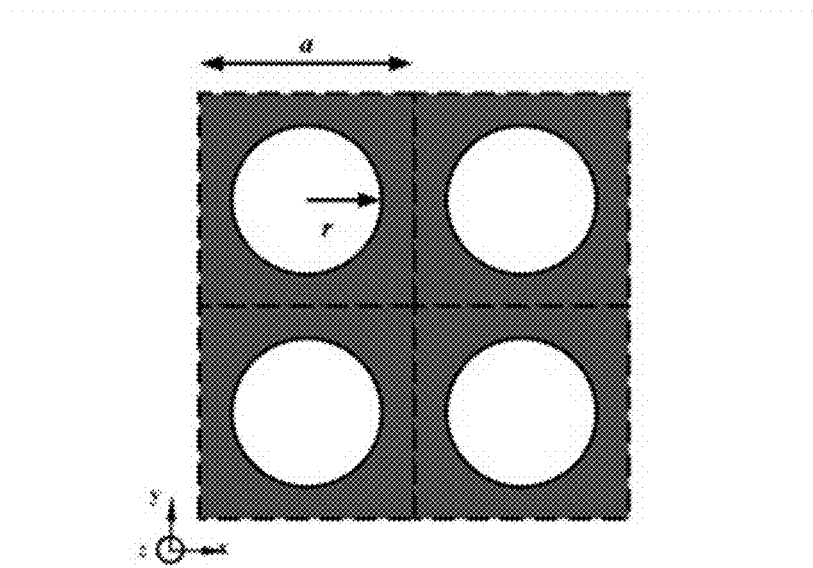
FIG. 10 shows an example schematics of a square photonic crystal lattice.

The basic structure consists of a square lattice with cylindrical holes in a silicon slab. All simulations in this disclosure are done by 3D finite-difference time-domain (FDTD) simulations. The simulation setup is shown in FIG. 10. The blue color region is silicon and the white color region is background. The simulation contains three main parameters, i.e., lattice constant a, radius r, and thickness t. Our computation region includes a unit cell of a square lattice, in which we impose periodic boundary conditions at the x and y boundaries. At the z boundary, Perfectly Matched Layer (PML) is used. We excite a broadband plane wave (1~1.6 μm) along the z direction and then retrieve the transmission spectrum at normal incidence.

At first, we use $SiO_2$ as the background material, and the refractive index is about 1.45. We find that the 3 dB-bandwidths of the transmission peaks are as small as 1~2 nm, and the two sidebands associated with a transmission peak cannot maintain a flap-top high-reflectivity spectrum. Note that to design a GMR optical filter for CWDM application, we need to have at least one high-reflectivity sideband and a wide transmission peak. To achieve s, we think that a larger refractive index contrast between the background material and slab material is needed.

But in practice, using air as the background material may cause all kinds of reliability issues. To increase the refractive index contrast we can use nanoporous $SiO_2$ as our background material. The refractive index of this material can be as low as 1.1, and hence we choose the background n=1.1 in the following simulations.

Figure 11:
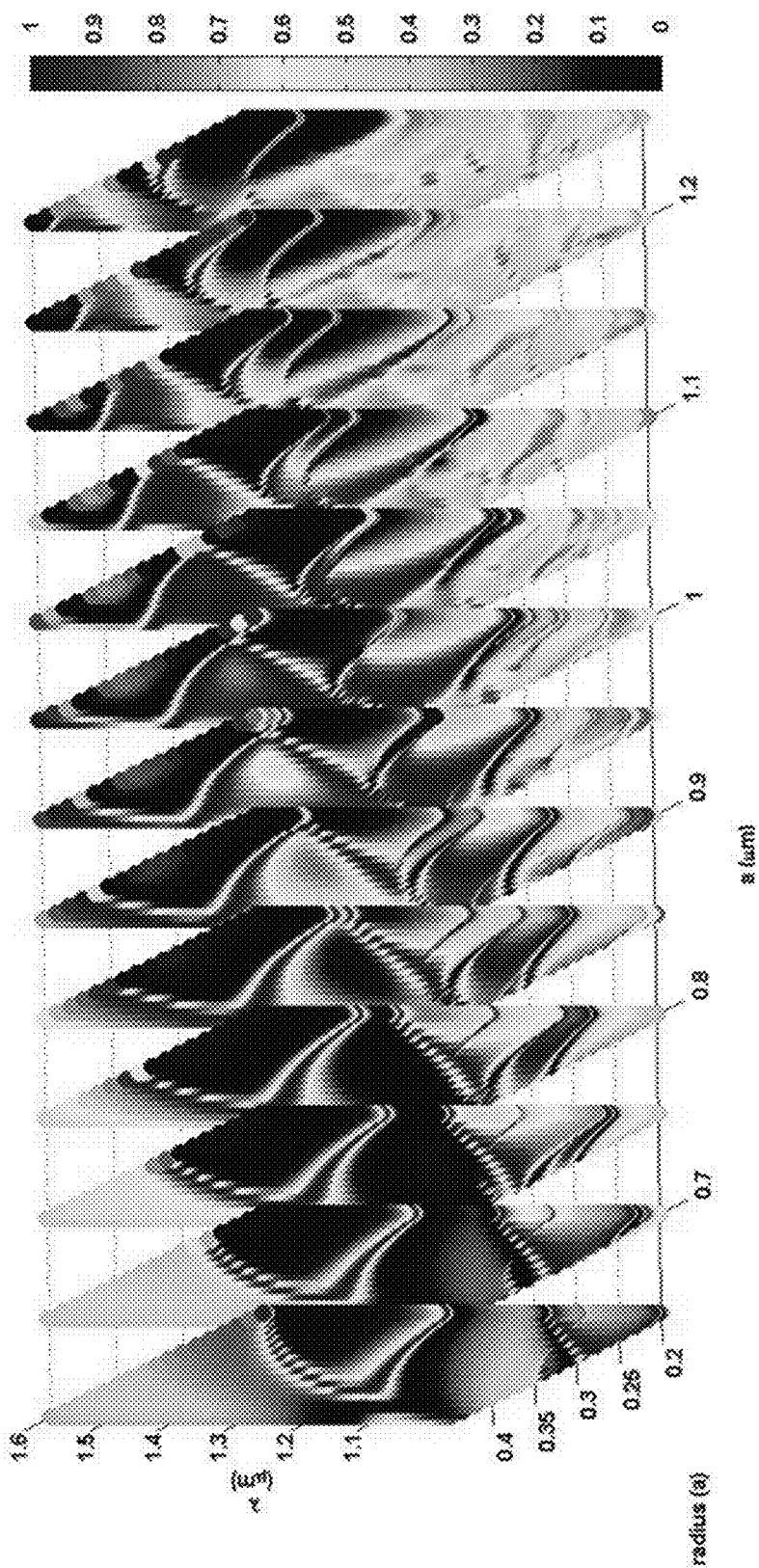
FIG. 11 shows an example of reflectivity as a function of wavelength.

For the purpose of finding a specific set of structure parameters, we first have all the data presented in a 3D figure (FIG. 11). In FIG. 11, we can clearly observe the overall trend of GMR transmissions/reflections. As mentioned previously, we are looking for a high-reflectivity region and a wide transmission peak. Making this 3D data representation can help us to analyze the system.

Figure 12:
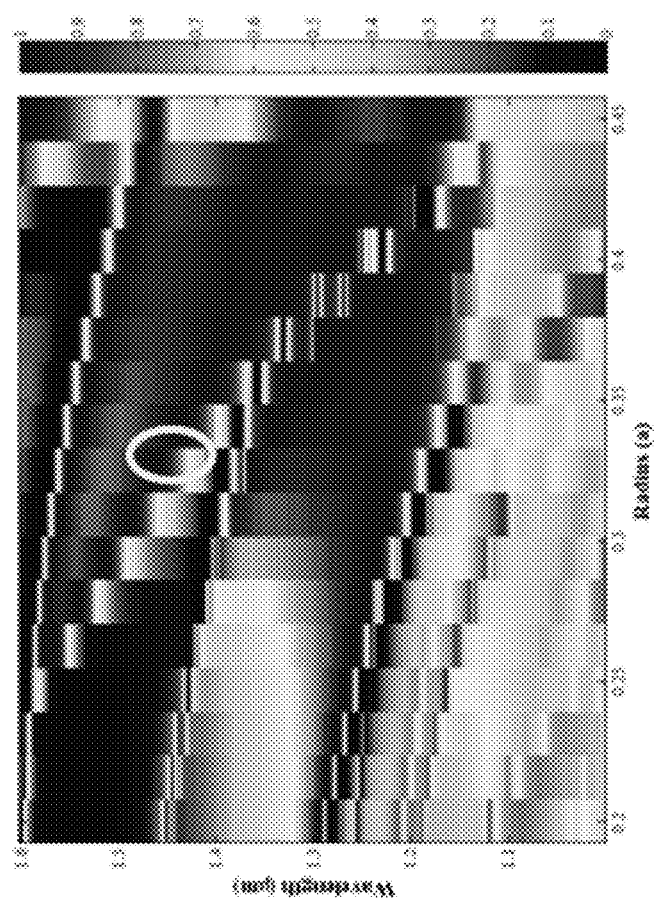
FIG. 12 shows an example of reflectivity as a function of radius.
Figure 13:
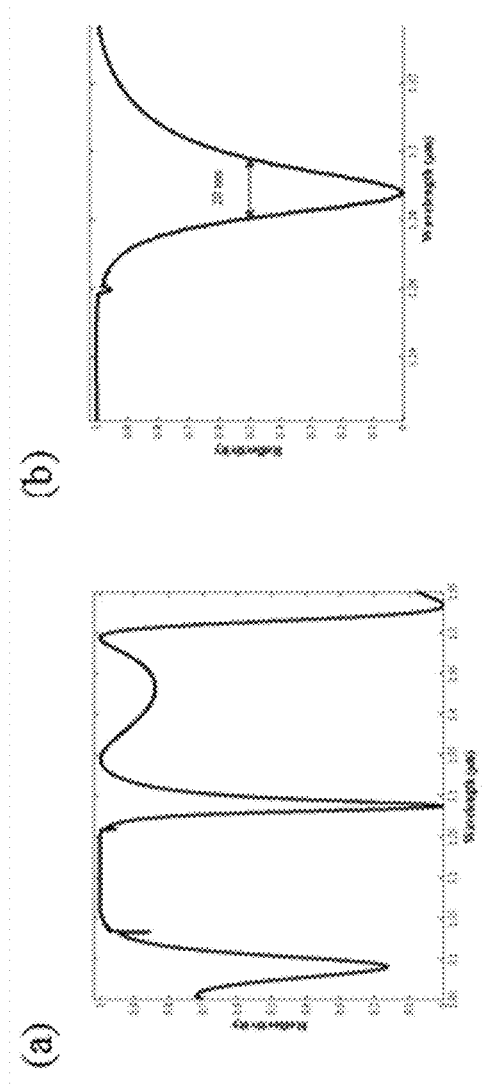
FIG. 13 shows an example of a reflection spectrum.

In this simulation example, we find that the structure with thickness around 225 nm features a region of high reflectivity, and the spectrum shows that the reflectivity rapidly drops to zero then raises back to nearly fully reflection. After taking a look at each 2D slice as shown in FIG. 12, it seems that our structure provides a transmission band when the radius of cylindrical hole equals to 0.35 a. Then we retrieve the particular reflection spectrum to confirm the transmission band properties. In FIG. 13, the PC slab thickness/lattice constant/radius are chosen to be 225 nm/1 μm/0.35 a, and a transmission band centered at 1.29 μm can be achieved. The 3 dB-bandwidth of this transmission peak is about 18 nm, and both of the sidebands are flap-top high-reflectivity regions.

Figure 14:
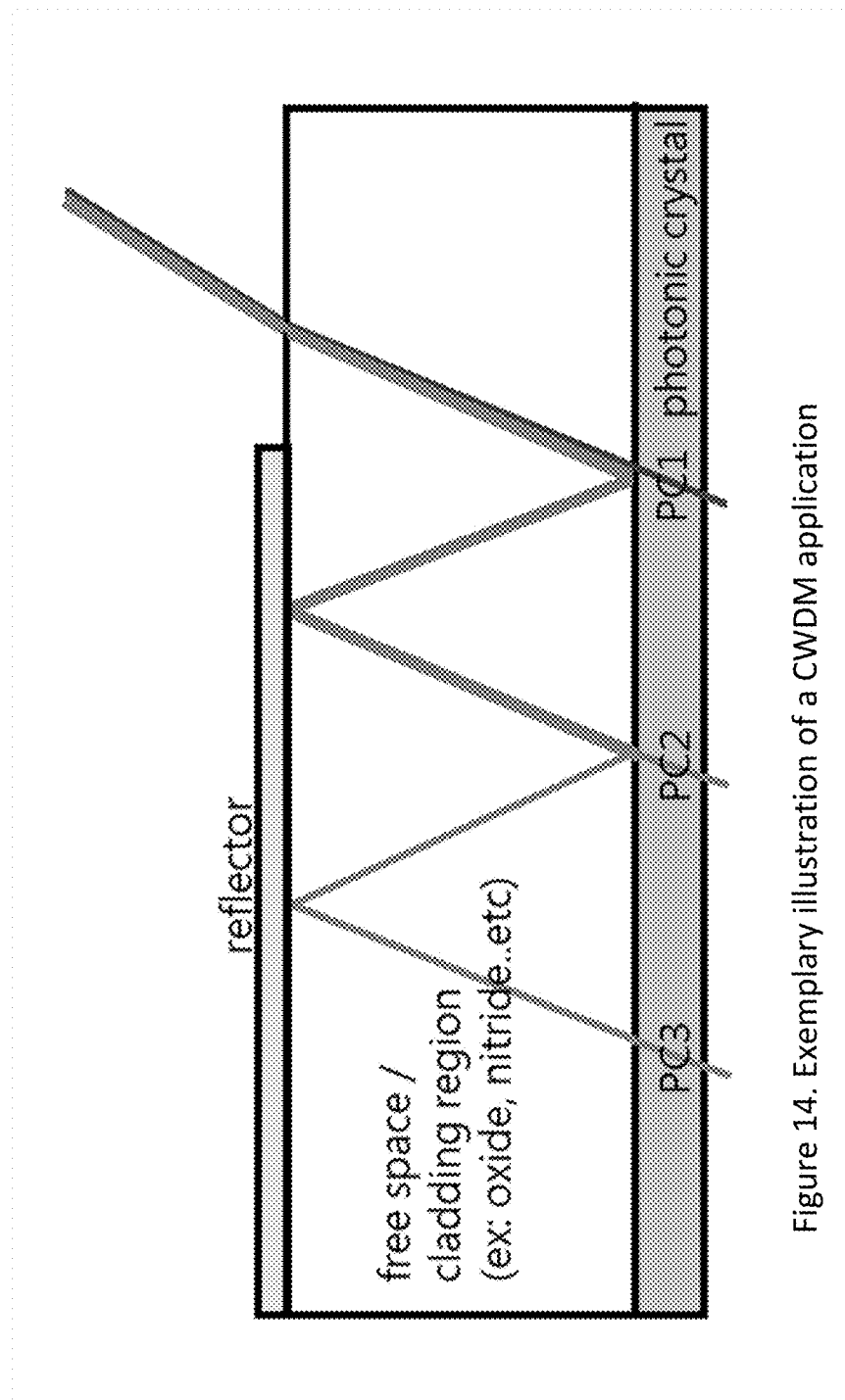
FIG. 14 shows an example of a CWDM application.
Figure 15:
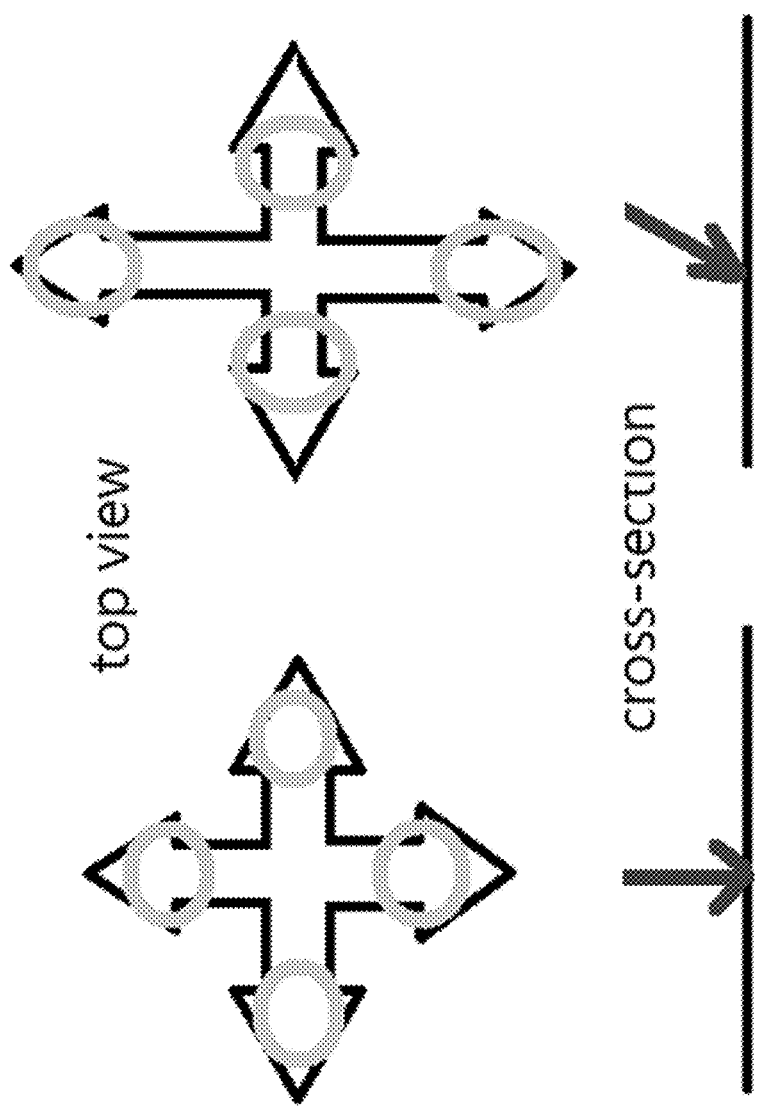
FIG. 15 shows an example of a polarization independent photonic crystal design.

Taking CWDM application as an example (FIG. 14), light (with multiple wavelengths) is incident into a free space region (ex: air, oxide cladding . . . etc) with a photonic crystal slab beneath. When the light hits the first PC area (PC1) which is designed to pass a certain wavelength spectrum (λ1) by tuning the design parameters mentioned above, the rest wavelength components are reflected back to the free space region. After another reflection at interface between the free space region and another medium on top of it, the light hits the second PC area (PC2), where another wavelength spectrum (λ2) is passed. A waveguide or a photo-detecting area can be placed beneath the certain PC area to couple or absorb the light with the desired wavelength. A reciprocal case can also be applied where multiple wavelengths may be combined into a single beam propagating along a certain direction. Furthermore, to maintain polarization insensitivity/independence, the photonic crystal can be designed to match the polarization profile of the incident light when it is projected onto the surface of the photonic crystal (FIG. 15).

Figure 16:
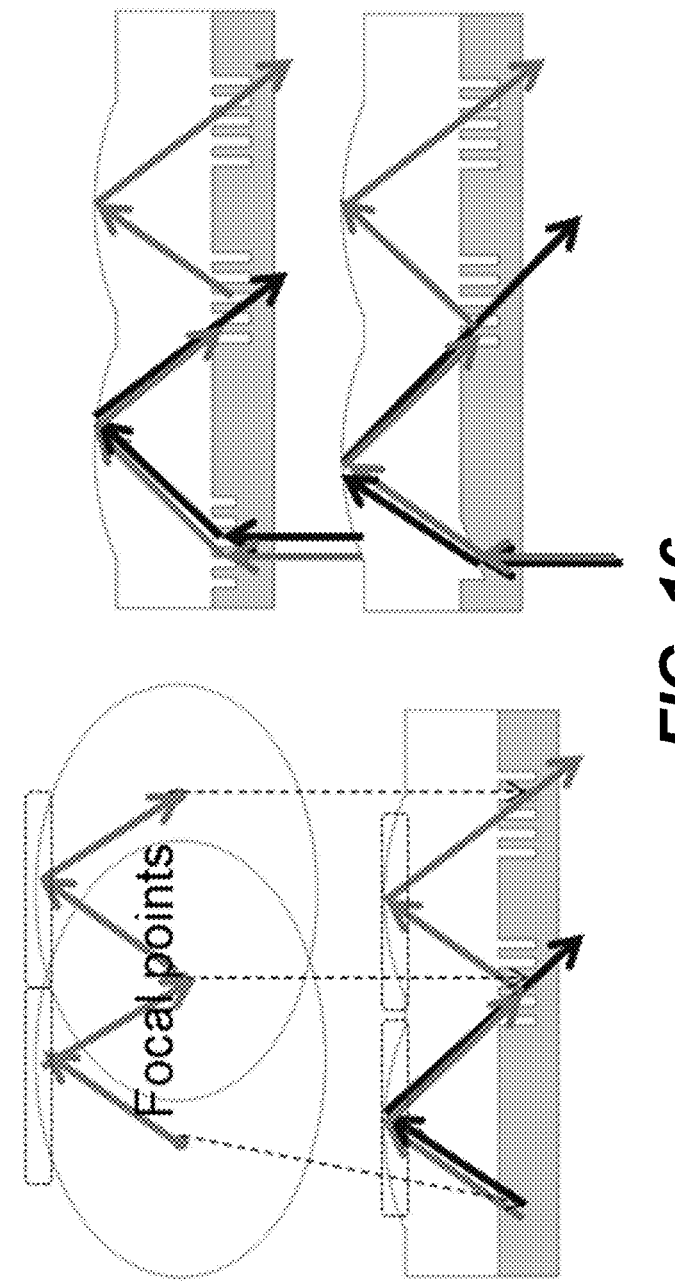
FIG. 16 shows an example of a CWDM application using an elliptical lens.

Referring to FIG. 16, for WDM application, other configurations shown below can also be used. The light can incident from an opening region or a transmissive lens region into the optical separation region (OSR) and then get guided inside the OSR via a reflective lens with elliptical curvature. By overlapping one elliptical focal point with the focal point of another ellipse, the light can be guided inside the OSR by transferring from one focal point to another focal point. Photonic crystal patterns can be used as filters to select the desired wavelengths. The light can incident normally or with an angle.

Figure 17:
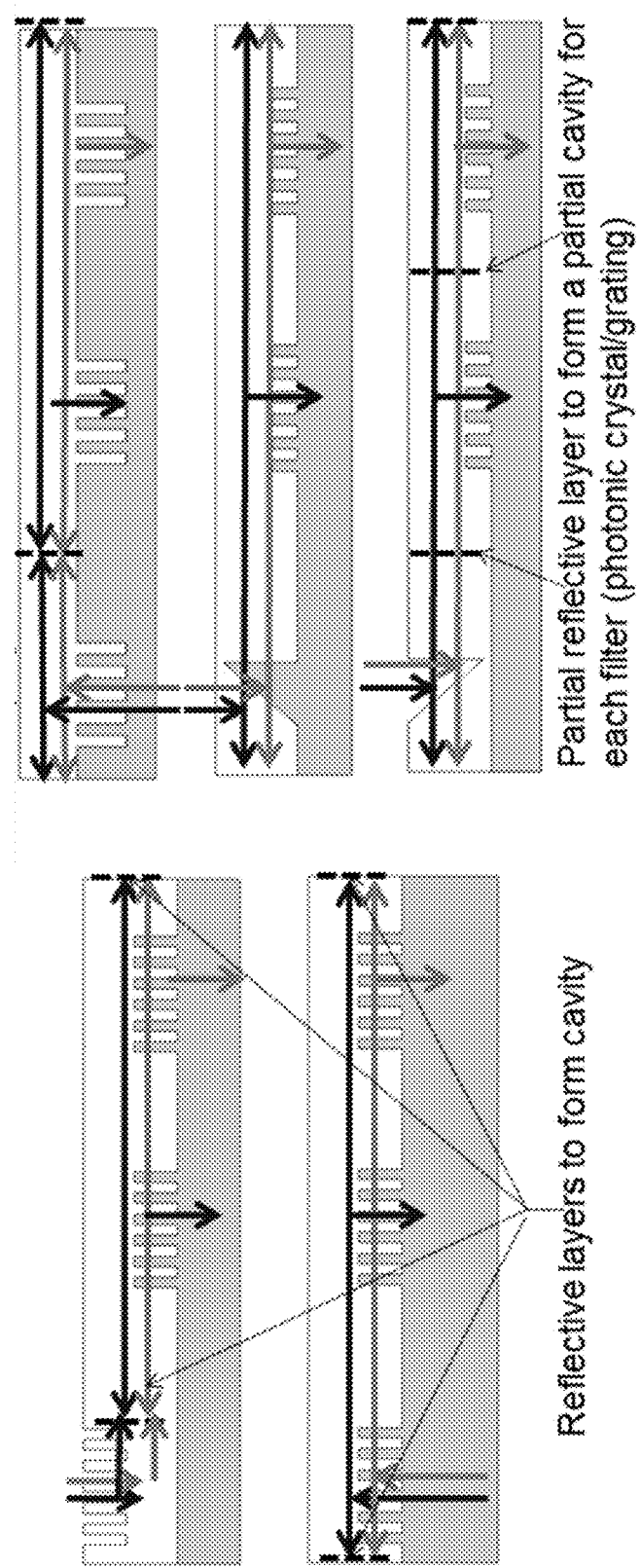
FIG. 17 shows an example of a CWDM application using gratings.

Referring to FIG. 17, for WDM application, other configurations shown below can also be used. In these implementations, filter can be partially embedded inside the OSR region. The entrance can be a grating coupler or a reflective lens with tilted angle. After incidence, the light can be confined or resonates in the OSR region by optionally adding highly reflective layers on both ends of the OSR along the light propagation directions, either including or excluding the entrance region. Furthermore, partial reflective layer can also be optionally added inside the OSR to separate different filter region as shown below. The positions of reflectors can be decided based on the location of the input (ex: lens/grating) and output (ex: grating) region. The drawings below are simply some exemplary illustrations.

Figure 18:
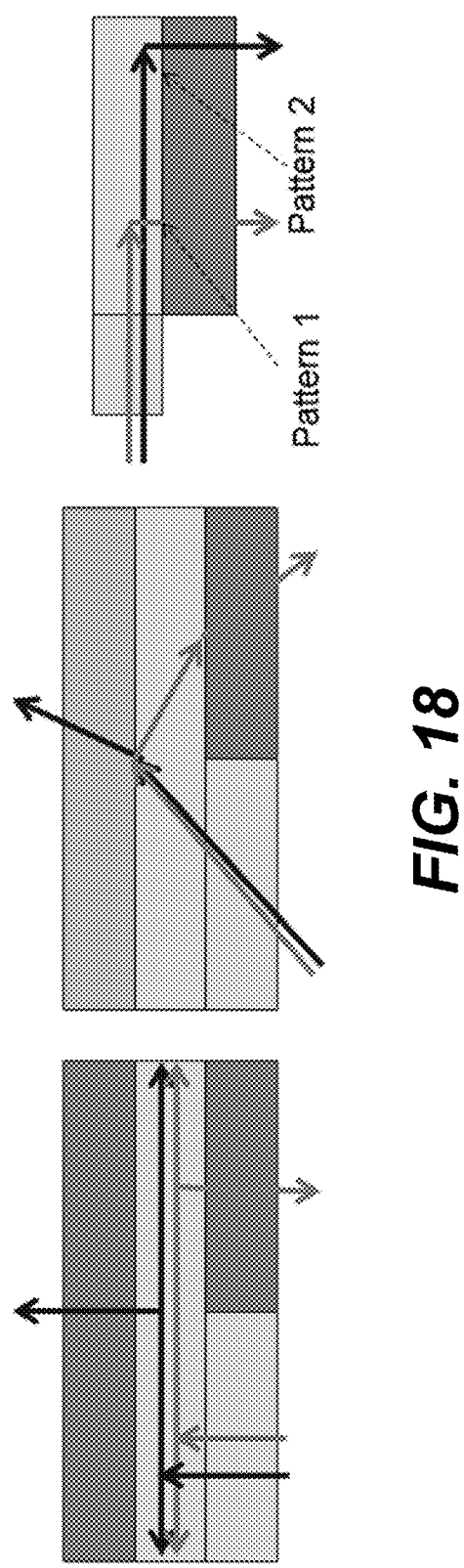
FIG. 18 shows an example of a CWDM application using waveguides.

Referring to FIG. 18, other than what has been described in this disclosure, there can be many other possible orientations/combinations based on the concept of using various building blocks to fulfill various applications. Some non-ideal factors (ex: process condition such as etching) might cause the performance to deviate from the theoretical ideal condition, but such slight deviation should not necessarily change the functionality of this disclosure, but might affect the performance such as focal length, filter center wavelength and bandwidth . . . etc. As a result, as long as its design concept follows this disclosure, any variations, derivations or different combinations/configurations of the building blocks in the description should also be viewed as within the scope of this disclosure. Also, note that the drawings in this disclosure are for illustrative purpose and not drawn to scale. For example, the curvature can be much smaller or even unnoticeable (close to flat) if it is caused primarily by process induced strain such as from the photonic crystal or the surrounding materials.

A number of implementations have been described. Nevertheless, it will be understood that various modifications may be made without departing from the spirit and scope of the disclosure. For example, various forms of the flows shown above may be used, with steps re-ordered, added, or removed. For example, in FIG. 9, step 906 can also be done before step 904.

Various implementations may have been discussed using two-dimensional cross-sections for easy description and illustration purpose. Nevertheless, the three-dimensional variations and derivations should also be included within the scope of the disclosure as long as there are corresponding two-dimensional cross-sections in the three-dimensional structures.

Embodiments and all of the functional operations described in this specification may be implemented in digital electronic circuitry, or in computer software, firmware, or hardware, including the structures disclosed in this specification and their structural equivalents, or in combinations of one or more of them. Embodiments may be implemented as one or more computer program products, i.e., one or more modules of computer program instructions encoded on a computer-readable medium for execution by, or to control the operation of, data processing apparatus. The computer readable-medium may be a machine-readable storage device, a machine-readable storage substrate, a memory device, a composition of matter affecting a machine-readable propagated signal, or a combination of one or more of them. The computer-readable medium may be a non-transitory computer-readable medium. The term "data processing apparatus" encompasses all apparatus, devices, and machines for processing data, including by way of example a programmable processor, a computer, or multiple processors or computers. The apparatus may include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal that is generated to encode information for transmission to suitable receiver apparatus.

A computer program (also known as a program, software, software application, script, or code) may be written in any form of programming language, including compiled or interpreted languages, and it may be deployed in any form, including as a standalone program or as a module, component, subroutine, or other unit suitable for use in a computing environment. A computer program does not necessarily correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one computer or on multiple computers that are located at one site or distributed across multiple sites and interconnected by a communication network.

The processes and logic flows described in this specification may be performed by one or more programmable processors executing one or more computer programs to perform functions by operating on input data and generating output. The processes and logic flows may also be performed by, and apparatus may also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer may be embedded in another device, e.g., a tablet computer, a mobile telephone, a personal digital assistant (PDA), a mobile audio player, a Global Positioning System (GPS) receiver, to name just a few. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD-ROM and DVD-ROM disks. The processor and the memory may be supplemented by, or incorporated in, special purpose logic circuitry.

To provide for interaction with a user, embodiments may be implemented on a computer having a display device, e.g., a CRT (cathode ray tube) or LCD (liquid crystal display) monitor, for displaying information to the user and a keyboard and a pointing device, e.g., a mouse or a trackball, by which the user may provide input to the computer. Other kinds of devices may be used to provide for interaction with a user as well; for example, feedback provided to the user may be any form of sensory feedback, e.g., visual feedback, auditory feedback, or tactile feedback; and input from the user may be received in any form, including acoustic, speech, or tactile input.

Embodiments may be implemented in a computing system that includes a back end component, e.g., as a data server, or that includes a middleware component, e.g., an application server, or that includes a front end component, e.g., a client computer having a graphical user interface or a Web browser through which a user may interact with an implementation of the techniques disclosed, or any combination of one or more such back end, middleware, or front end components. The components of the system may be interconnected by any form or medium of digital data communication, e.g., a communication network. Examples of communication networks include a local area network ("LAN") and a wide area network ("WAN"), e.g., the Internet.

The computing system may include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations, but rather as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems may generally be integrated together in a single software product or packaged into multiple software products.

Thus, particular embodiments have been described. Other embodiments are within the scope of the following claims. For example, the actions recited in the claims may be performed in a different order and still achieve desirable results.

What is claimed is:
1. An optical apparatus comprising:
an optical medium;
a refractive element formed above the optical medium, the refractive element comprising:
   a surface with a predetermined radius of curvature; and
   a group of periodic structures formed on the surface, wherein the refractive element is configured to refract or to filter one or more wavelengths of an incident light; and
a modulation element coupled to the refractive element, the modulation element changes an effective refractive index of the refractive element by applying an electrical field to the refractive element to cause a change in a carrier concentration or a change in a mechanical structure, wherein the modulation element includes a p-n junction.

2. The optical apparatus of claim 1, further comprising:
a cladding element formed over the refractive element, wherein an effective refractive index of the cladding element is lower than an effective refractive index of the refractive element.

3. The optical apparatus of claim 2, wherein the cladding element comprises one or more layers of nitride, oxide, air, or an organic material.

4. The optical apparatus of claim 1, wherein the group of periodic structures possesses a 90 degree rotational symmetry.

5. The optical apparatus of claim 1, wherein the optical medium further comprises an active element configured to absorb at least a portion of the incident light or to emit light.

6. The optical apparatus of claim 5, wherein the active element comprises one or more layers of silicon, germanium, tin, or III-V compounds.

7. The optical apparatus of claim 1, furthering comprising a second refractive element optically coupled to the refractive element, wherein an effective refractive index of the second refractive element is different from or equal to an effective refractive index of the refractive element.

8. The optical apparatus of claim 7, wherein the second refractive element comprises a second group of periodic structures.

9. The optical apparatus of claim 1, further comprising:
a modulation element coupled to the refractive element, the modulation element configured to change a direction of at least a portion the incident light exiting the refractive element, a depth of focus of the incident light exiting the refractive element, or a selection of one or more wavelengths filtered by the group of periodic structures of the refractive element.

10. The optical apparatus of claim 9, wherein the modulation element includes a Micro-Electro-Mechanical System (MEMS) configured to apply an electrical field to exert a mechanical force to change (i) the predetermined radius of curvature of the surface, (ii) a position of the refractive element relative to the optical medium, (iii) or an orientation of the refractive element relative to an optical axis of the incident light.

11. The optical apparatus of claim 1, wherein the predetermined radius of curvature of the refractive element is formed by a process-related strain.

12. The optical apparatus of claim 1, wherein the predetermined radius of curvature of the refractive element is formed by using a grayscale mask.

13. The optical apparatus of claim 1, wherein the group of periodic structures are configured to focus or defocus the incident light by a joint phase shift.

14. The optical apparatus of claim 1, wherein the group of periodic structures are configured to filter one or more wavelengths of the incident light by a guided mode resonance.

15. The optical apparatus of claim 1, wherein the refractive element includes silicon partially filled with nitride or oxide or air.

16. The optical apparatus of claim 1, wherein to filter, focus, or defocus one or more wavelengths of the incident light, (i) one or more periodic structures of the group of periodic structures are filled with a material having a different refractive index from an effective refractive index of the refractive element, (ii) one or more periodic structures of the group of periodic structures are formed to have a different radius from a radius of one or more other periodic structures of the group of periodic structures, or (iii) a plurality of periodic structures of the group of periodic structures are formed with a locally non-uniform period.

17. The optical apparatus of claim 1, wherein a thickness of the optical medium corresponds to a focal length of the refractive element.

18. The optical apparatus of claim 1, wherein the refractive element is bonded to a layer formed on the optical medium.

* * * * *

UNITED STATES PATENT AND TRADEMARK OFFICE
CERTIFICATE OF CORRECTION

PATENT NO. : 9,651,718 B2  
APPLICATION NO. : 14/601737  
DATED : May 16, 2017  
INVENTOR(S) : Chen et al.

Page 1 of 1

It is certified that error appears in the above-identified patent and that said Letters Patent is hereby corrected as shown below:

In Claim 7, Column 21, Line 22, delete "furthering" and insert -- further --, therefor.

Signed and Sealed this  
Twenty-second Day of August, 2017

Joseph Matal  
*Performing the Functions and Duties of the*  
*Under Secretary of Commerce for Intellectual Property and*  
*Director of the United States Patent and Trademark Office*